(12) United States Patent
Huang

(10) Patent No.: US 10,714,612 B2
(45) Date of Patent: Jul. 14, 2020

(54) HIGH VOLTAGE DEVICE AND MANUFACTURING METHOD THEREOF

(71) Applicant: RICHTEK TECHNOLOGY CORPORATION, Zhubei, Hsinchu (TW)

(72) Inventor: Tsung-Yi Huang, Hsinchu (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 0 days.

(21) Appl. No.: 16/232,030

(22) Filed: Dec. 25, 2018

(65) Prior Publication Data

US 2019/0341491 A1    Nov. 7, 2019

(30) Foreign Application Priority Data

May 4, 2018 (TW) .............................. 107115345 A

(51) Int. Cl.
*H01L 29/06* (2006.01)
*H01L 29/78* (2006.01)
*H01L 29/08* (2006.01)

(52) U.S. Cl.
CPC ...... *H01L 29/7835* (2013.01); *H01L 29/0653* (2013.01); *H01L 29/0657* (2013.01);
(Continued)

(58) Field of Classification Search
CPC ............ H01L 29/7816; H01L 29/7817; H01L 29/7824; H01L 29/66681; H01L 29/66689; H01L 29/063; H01L 29/401; H01L 29/1095; H01L 29/402; H01L 29/404; H01L 29/405; H01L 29/7835; H01L 29/0653; H01L 29/7813; H01L 29/086; H01L 29/0657; H01L 29/0878; H01L 29/7831; H01L 29/408; H01L 29/41; H01L 29/06; H01L 29/0603; H01L 29/0607; H01L 29/0623; H01L 29/0634; H01L 29/0638; H01L 29/0642; H01L 29/0692; H01L 29/08; H01L 29/808; H01L 29/66901; H01L 29/1066; H01L 29/78; H01L 29/6681; H01L 29/0615; H01L 29/0661; H01L 29/0865; H01L 29/0886; H01L 29/41725; H01L 29/4238; H01L 29/0834; H01L 29/73; H01L 29/8086;
(Continued)

(56) References Cited

U.S. PATENT DOCUMENTS

2004/0232522 A1* 11/2004 Shimizu ............... H01L 21/763
                                                                257/548
2007/0069308 A1*  3/2007 Ko ....................... H01L 29/402
                                                                257/401
(Continued)

*Primary Examiner* — Natalia A Gondarenko
(74) *Attorney, Agent, or Firm* — Tung & Associates

(57) ABSTRACT

A high voltage device includes: a semiconductor layer, an isolation structure, a drift oxide region, a well, a body region, a gate, at least one sub-gate, a source, a drain and a conductive connection structure. The drift oxide region is located on a drift region in an operation region. The sub-gate is formed on the drift oxide region in the operation region. The sub-gate is a rectangle shape extending along a width direction, and in parallel with the gate. A conductive connection structure connects the gate and the sub-gate.

18 Claims, 19 Drawing Sheets

(52) U.S. Cl.
CPC ........ *H01L 29/086* (2013.01); *H01L 29/0878* (2013.01); *H01L 29/7813* (2013.01); *H01L 29/7831* (2013.01)

(58) Field of Classification Search
CPC ............. H01L 29/7811; H01L 29/0619; H01L 29/0649; H01L 29/0696; H01L 29/7832; H01L 29/0847; H01L 29/66659; H01L 29/7838; H01L 29/0843; H01L 29/0882; H01L 29/1083; H01L 29/41758; H01L 29/42316; H01L 29/6606; H01L 29/66893; H01L 29/66568; H01L 29/66674; H01L 29/70; H01L 29/7424; H01L 29/7801; H01L 29/7809; H01L 29/80; H01L 2924/13091; H01L 2924/1305; H01L 2924/13055; H01L 2924/13062; H01L 27/0259; H01L 27/0266; H01L 27/0623; H01L 27/098; H01L 27/0617; H01L 21/02697; H01L 21/761; H01L 21/8232; H01L 2224/49111
USPC ....... 257/339, 335, 336, 343, 369, 408, 409, 257/481, 104, 493, 548
See application file for complete search history.

(56) References Cited

U.S. PATENT DOCUMENTS

| | | | | |
|---|---|---|---|---|
| 2013/0277741 | A1* | 10/2013 | Guowei | ................ H01L 29/402 257/343 |
| 2015/0008539 | A1* | 1/2015 | Kanda | ................... H01L 29/402 257/409 |
| 2017/0263761 | A1* | 9/2017 | Hu | .................... H01L 21/28008 |

* cited by examiner

HIGH VOLTAGE DEVICE AND MANUFACTURING METHOD THEREOF

CROSS REFERENCES

The present invention claims priority to TW 107115345 filed on May 4, 2018.

BACKGROUND OF THE INVENTION

Field of Invention

The present invention relates to a high voltage device and a manufacturing method thereof; particularly, it relates to a high voltage device having increased breakdown voltage during an OFF operation and a manufacturing method thereof.

Description of Related Art

FIGS. 1A and 1B show a cross-sectional view and a top view, respectively, of a conventional high voltage device 100. A high voltage device, in the context of this invention, refers to a device whose drain is capable of receiving a voltage which is higher than 5V during a normal operation. In general, the drain and the gate of the high voltage device are separated by a drift region 12a in between (as indicated by the dashed line of FIG. 1A), and the lateral length of the drift region 12a is determined according to the voltage that the device requires to withstand in normal operation. As shown in FIGS. 1A and 1B, the high voltage device 100 includes a well region 12, an isolation structure 13, a drift oxide region 14, a body region 16, a gate 17, a source 18, and a drain 19. The well region 12 which is N-type is formed on the substrate 11, and the isolation structure 13 is a local oxidation of silicon (LOCOS) structure for defining an operation region 13a as an active region when the high-voltage device 100 operates. The range of the operation region 13a is indicated by the thick black dashed line in FIG. 1B. The gate 17 covers a part of the drift oxide region 14. To reduce the on-resistance of the high voltage device 100, the thickness of the isolation structure 13And the drift oxide region 14 can be reduced, but the breakdown voltage of the high voltage device 100 will be decreased accordingly, limiting the application range of the high voltage device 100; on other hand, to increase the withstand voltage of the high voltage device 100, the thickness of the isolation structure 13And the drift oxide region 14 can be increased, but the on-resistance of the high voltage device 100 will be increased accordingly, to lower the operation speed and the performance of the device.

In view of the above, the present invention provides a high voltage device having increased breakdown voltage during an OFF operation without sacrificing its on-resistance, and a manufacturing method thereof.

SUMMARY OF THE INVENTION

From one perspective, the present invention provides a high voltage device comprising: a semiconductor layer formed on a substrate, wherein the semiconductor layer has a top surface and a bottom surface opposite to the top surface in a vertical direction; an isolation structure formed on the top surface and connects the top surface, wherein the isolation structure defines an operation region; a drift oxide region formed on the top surface and connects the top surface, wherein the drift oxide region is located on a drift region of the operation region and connects the drift region; a well region having a first conductivity type, wherein the well region is formed in the operation region of the semiconductor layer and is located beneath the top surface and connects the top surface in the vertical direction; a body region having a second conductivity type, wherein the body region is formed in the well region in the operation region and is located beneath the top surface and connects the top surface; a gate formed on the top substrate in the operation region of the semiconductor layer, wherein from top view, the gate is substantially a rectangle shape extending along a width direction, and a portion of the body region is located beneath the gate and connects the gate in the vertical direction, to provide a current channel of the high voltage device during ON operation of the high voltage device; at least one sub-gate formed on the drift oxide region in the operation region, wherein from top view, the sub-gate is substantially a rectangle shape extending along the width direction and the sub-gate and the gate are arranged in parallel, and the sub-gate is located on the drift oxide region and connects the drift oxide region in the vertical direction; a source and a drain having the first conductivity type, the source and the drain being formed beneath the top surface and connect the top surface in the operation region, and the source and the drain being located below the gate respectively at two sides of the gate in a channel direction, wherein the drift region is located between the drain and the body region in the channel direction, in the well region near the top surface, to serve as a drift current channel during ON operation of the high voltage device, and from top view, the sub-gate is located between the gate and the drain in the channel direction; and a conductive connection structure made of a conductor, which is located on the gate and electrically connects the gate and at least one sub-gate.

From another perspective, the present invention provides a manufacturing method of a high voltage device, comprising: forming a semiconductor layer on a substrate, wherein the semiconductor layer has a top surface and a bottom surface opposite to the top surface in a vertical direction; forming an isolation structure on and connecting the top surface, wherein the isolation structure defines an operation region; forming a drift oxide region on and connecting the top surface, wherein the drift oxide region is located on a drift region of the operation region and connects the drift region; forming a well region in the operation region of the semiconductor layer, wherein the well region is located beneath the top surface and connects the top surface, the well region having a first conductivity type; forming a body region in the well region in the operation region, wherein the body region is located beneath the top surface and connects the top surface, the body region having a second conductivity type; forming a gate on the top surface in the operation region of the semiconductor layer, wherein from top view, the gate is substantially a rectangle shape extending along a width direction, and a portion of the body region is located beneath the gate and connects the gate in the vertical direction, to provide a current channel of the high voltage device during ON operation of the high voltage device; forming at least one sub-gate on the drift oxide region in the operation region, wherein from top view, the sub-gate is substantially a rectangle shape extending along the width direction and the sub-gate and the gate are arranged in parallel, and the sub-gate is located on the drift oxide region and connects the drift oxide region in the vertical direction; forming a source and a drain beneath and connecting the top surface in the vertical direction, the source and the drain having the first conductivity type, the source and the drain being formed in the operation region and being located below the gate respectively at two sides of the gate in a channel direction, wherein the drift region is located between the drain and the body region in the channel direction, in the well region near the top surface, to serve as a drift current channel during ON operation of the high voltage device, and from top view, the sub-gate is located between the gate and the drain in the channel direction; and forming a conductive connection structure made of a conductor on the gate, wherein the conductive connection structure electrically connects the gate and the at least one sub-gate.

From another perspective, the present invention provides a high voltage device comprising: a semiconductor layer formed on a substrate, wherein the semiconductor layer has a top surface and a bottom surface opposite to the top surface in a vertical direction; an isolation structure formed on the top surface and connects the top surface, wherein the isolation structure defines an operation region; a drift oxide region formed on the top surface and connects the top surface, wherein the drift oxide region is located on a drift region of the operation region and connects the drift region; a drift well region having a first conductivity type, wherein the drift well region is formed beneath the top surface in the operation region of the semiconductor layer and the drift well region is located beneath the top surface and connects the top surface in the vertical direction; a channel well region having the second conductivity type, wherein the channel well region is formed beneath the top surface in the operation region and connects the drift well region in a channel direction; a buried layer having the first conductivity type, wherein the buried layer is formed beneath the channel well region and connects the channel well region, and the buried layer in the operation region completely covers a lower side of the channel well region; a gate formed on the top substrate in the operation region of the semiconductor layer, wherein the gate is substantially a rectangle shape extending along a width direction, and a portion of the channel well region is located beneath the gate in the vertical direction, to provide a current channel of the high voltage device during ON operation of the high voltage device; at least one sub-gate formed on the drift oxide region in the operation region, wherein the sub-gate is substantially a rectangle shape extending along the width direction and the sub-gate and the gate are arranged in parallel, and the sub-gate is located on the drift oxide region and connects the drift oxide region in the vertical direction; a source and a drain having the first conductivity type, the source and the drain being formed beneath the top surface and connect the top surface in the operation region, and the source and the drain being located below the gate respectively at two sides of the gate in a channel direction, wherein the drift region is located between the drain and the channel well region in the channel direction, in the well region near the top surface, to serve as a drift current channel during ON operation of the high voltage device, and from top view, the sub-gate is located between the gate and the drain in the channel direction; and a conductive connection structure made of a conductor, which is located on the gate and electrically connects the gate and the at least one sub-gate.

From another perspective, the present invention provides a manufacturing method of a high voltage device, comprising: forming a semiconductor layer on a substrate, wherein the semiconductor layer has a top surface and a bottom surface opposite to the top surface in a vertical direction; forming an isolation structure on and connecting the top surface, wherein the isolation structure defines an operation region; forming a drift oxide region on and connecting the top surface, wherein the drift oxide region is located on a drift region of the operation region and connects the drift region; forming a drift well region beneath the top surface in the operation region of the semiconductor layer, wherein the drift well region has a first conductivity type; forming a channel well region in the operation region, beneath the top surface in the vertical direction and connecting the drift oxide region in a channel direction, wherein the channel well region has a second conductivity type; forming a buried layer beneath the channel well region and connecting the channel well region in the vertical direction, wherein the buried layer in the operation region completely covers a lower side of the channel well region, and the buried layer has the first conductivity type; forming a gate on the top surface in the operation region of the semiconductor layer, wherein from top view, the gate is substantially a rectangle shape extending along a width direction, and a portion of the channel well region is located beneath the gate in the vertical direction, to provide a current channel of the high voltage device during ON operation of the high voltage device; forming at least one sub-gate on the drift oxide region in the operation region, wherein from top view, the sub-gate is substantially a rectangle shape extending along the width direction and the sub-gate and the gate are arranged in parallel, and the sub-gate is located on the drift oxide region and connects the drift oxide region in the vertical direction; forming a source and a drain beneath and connecting the top surface in the vertical direction, the source and the drain having the first conductivity type, the source and the drain being formed in the operation region and being located below the gate respectively at two sides of the gate in a channel direction, wherein the drift region is located between the drain and the channel well region in the channel direction, in the well region near the top surface, to serve as a drift current channel during ON operation of the high voltage device, and from top view, the sub-gate is located between the gate and the drain in the channel direction; and forming a conductive connection structure made of a conductor on the gate, wherein the conductive connection structure electrically connects the gate and the at least one sub-gate.

In one preferable embodiment, the drift oxide region includes a local oxidation of silicon (LOCOS) structure, a shallow trench isolation (STI) structure, a chemical vapor deposition (CVD) oxide structure, or a gate oxide layer.

In one preferable embodiment, the sub-gate is indirectly connected with the gate through the conductive connection structure, and the sub-gate and the conductive structure are not directly connected with each other.

In one preferable embodiment, the sub-gate includes a sub-gate conductive layer and a sub-gate spacer.

In one preferable embodiment, the drift oxide region is a one-piece structure.

The objectives, technical details, features, and effects of the present invention will be better understood with regard to the detailed description of the embodiments beneath.

DESCRIPTION OF THE PREFERABLE EMBODIMENTS

The drawings as referred to throughout the description of the present invention are for illustration only, to show the interrelations among the process steps and the layers, but the shapes, thicknesses, and widths are not drawn in actual scale.

Figure 1A:
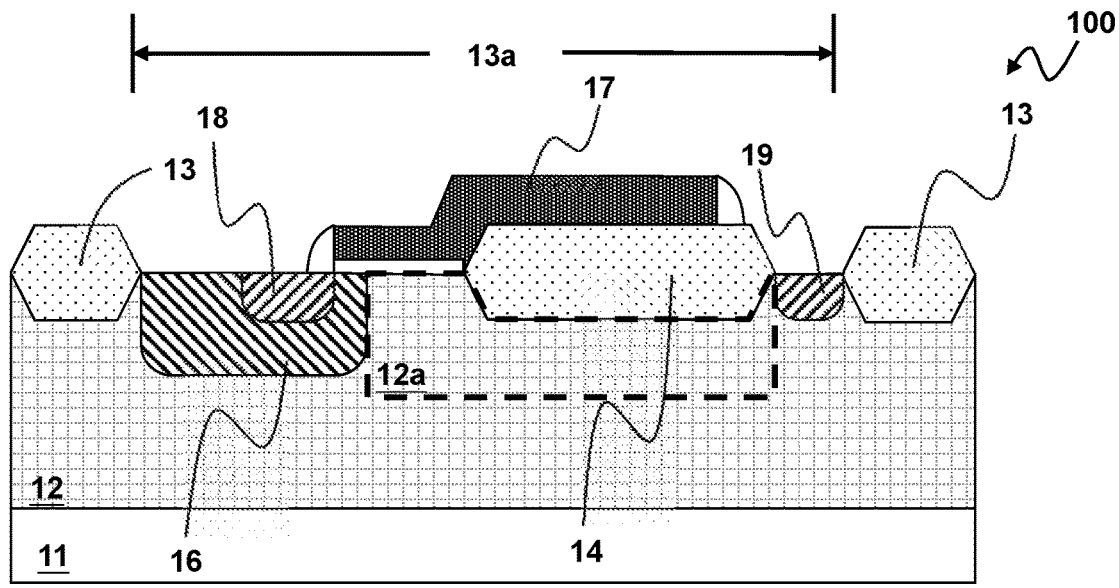
FIGS. 1A and 1B show a cross-sectional view and a top view of a conventional high voltage device 100, respectively.
Figure 1B:
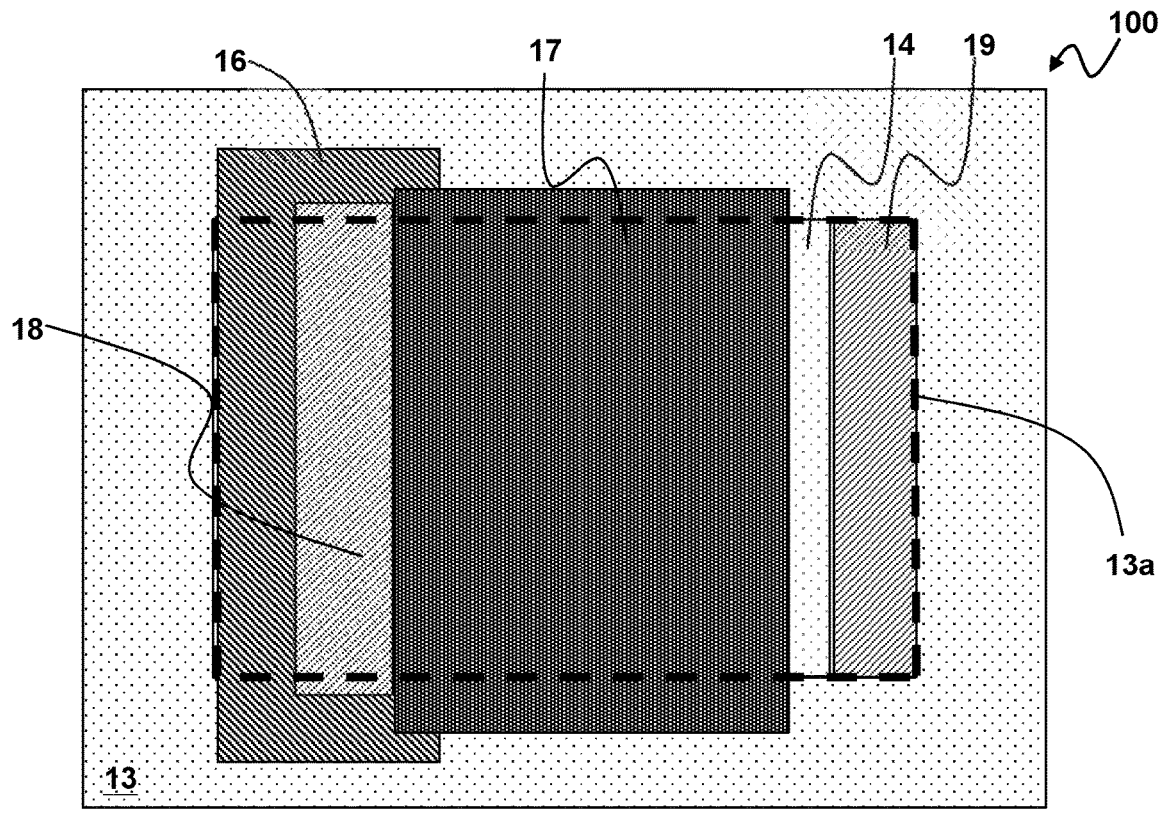
Figure 2A:
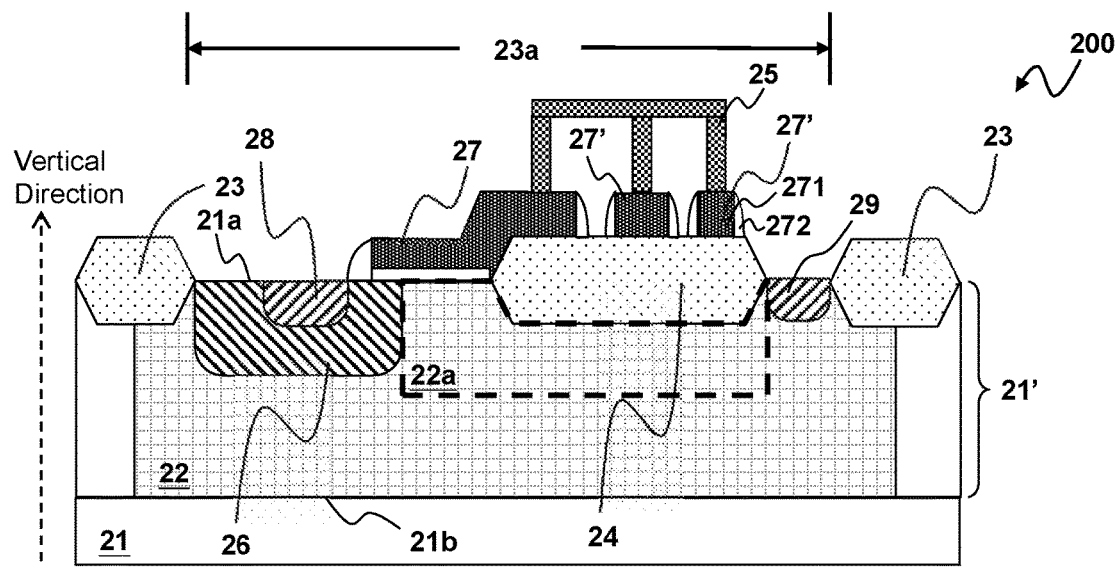
FIGS. 2A and 2B show a first embodiment of the present invention.
Figure 2B:
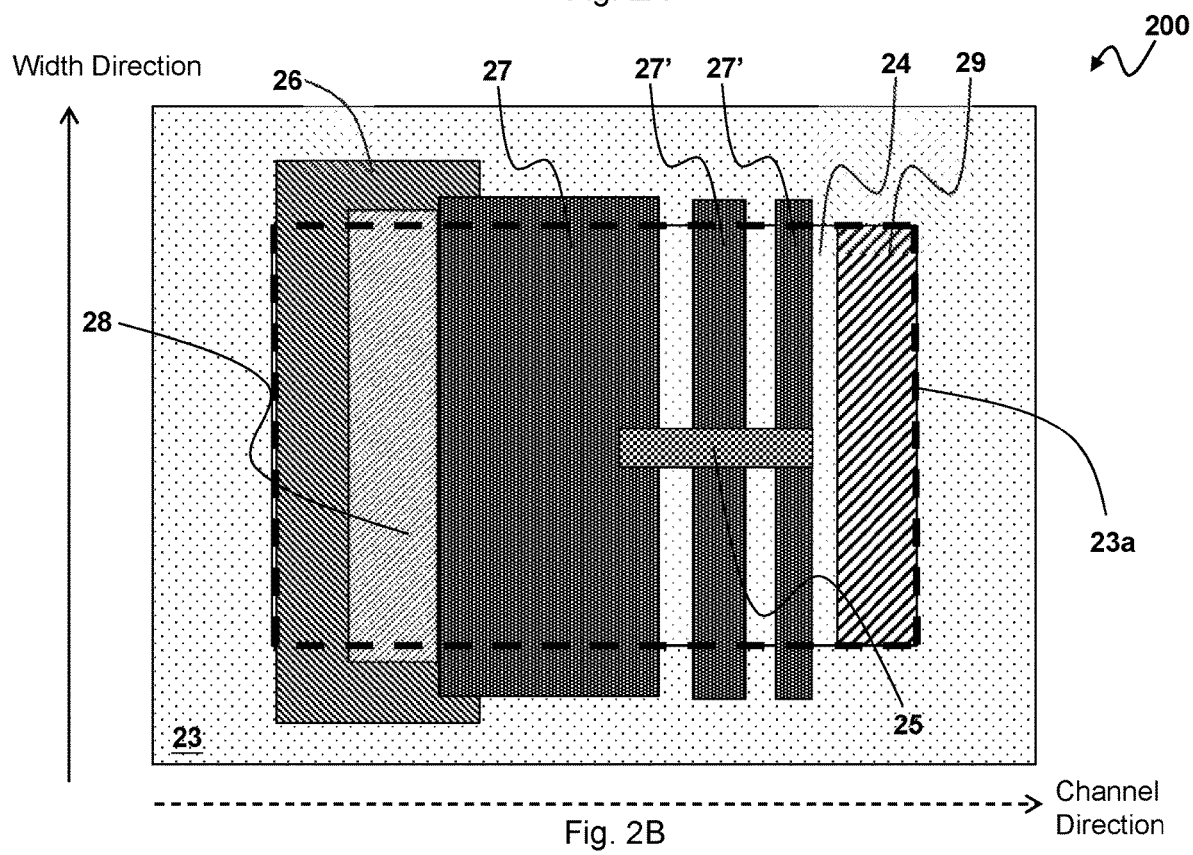

Please refer to FIGS. 2A and 2B, which show a first embodiment of the present invention. FIGS. 2A and 2B respectively show a cross-sectional view and a top view of a high voltage device 200. As shown in FIGS. 2A and 2B, the high voltage device 200 includes a semiconductor layer 21', a well region 22, an isolation structure 23, a drift oxide region 24, a conductive connection structure 25, a body region 26, a gate 27, at least one sub-gate 27', a source 28, and a drain 29. The semiconductor layer 21' is formed on the substrate 21, and the semiconductor layer 21' has a top surface 21a and a bottom surface 21b opposite to the top surface 21a in the vertical direction (as indicated by the direction of the dashed arrow in FIG. 2A). The substrate 21 is, for example, a P-type or N-type semiconductor silicon substrate. The semiconductor layer 21', for example, is formed on the substrate 21 by epitaxy, or, a part of the substrate 21 is used to form the semiconductor layer 21'. The semiconductor layer 21' can be formed by various methods known to a person having ordinary skill in the art, so the details thereof are not redundantly explained here.

Still referring to FIGS. 2A and 2B, the isolation structure 23 is formed on the top surface 21a and connects the top surface 21a; the isolation structure 23 defines an operation region 23a (as indicated by the dashed line in FIG. 2B). The isolation structure 23 is not limited to the local oxidation of silicon (LOCOS) structure as shown in the figure, and may instead be a shallow trench isolation (STI) structure. The drift oxide region 24 is formed on the top surface 21a and connects the top surface 21a, and is located on the drift region 22a (as indicated by the dashed line in FIG. 2A) in the operation region 23a and connects the drift region 22a.

The well region 22 which has a first conductivity type is formed in the operation region 23a of the semiconductor layer 21', and the well region 22 is located beneath the top surface 21a and connects the top surface 21a in the vertical direction. The body region 26 which has a second conductivity type is formed in the well region 22 of the operation region 23a, and the body region 26 is located beneath the top surface 21a and connects the top surface 21a in the vertical direction. The gate 27 is formed on the top surface 21a in the operation region 23a of the semiconductor layer 21'. From top view, the gate 27 is substantially a rectangle shape extending along a width direction (as indicated by the direction of the solid arrow in FIG. 2B), wherein a portion of the body region 26 is located beneath the gate 27 and connects the gate 27 in the vertical direction to provide a current channel of the high voltage device 200 during ON operation.

Still referring to FIGS. 2A and 2B, the sub-gate 27' is formed on drift oxide region 24 in the operating region 23a. From the top view of FIG. 2B, the sub-gate 27' has a substantially rectangle shape and extends in the width direction in parallel with the gate 27. The sub-gate 27' is located on the drift oxide region 24 and connects the drift oxide region 24 in the vertical direction. In the present embodiment, the high voltage device 200 includes two sub-gates 27' as an illustrative example. The high voltage device of the present invention may include one or plural sub-gates.

The source 28 and the drain 29 have the first conductivity type. The source 28 and the drain 29 are formed beneath the top surface 21a and connect the top surface 21a of the operation region 23a in the vertical direction, and the source 28 and the drain 29 are located below the gate 27 respectively at two sides of the gate in the channel direction (as indicated by the direction of the dashed arrow in FIG. 2B); the source 28 is located in the body region 26, and the drain 29 is located in the well region 22 and away from the body region 26. The drift region 22a is located between the drain 29 and the body region 26 in the channel direction, in the well region 22 near the top surface 21a, to serve as a drift current channel of the high voltage device 200 during ON operation. From the top view of FIG. 2B, the sub-gate 27' is located between the gate 27 and the drain 29 in the channel direction, and from the cross-sectional view of FIG. 2A, the source 28 and the drain 29 are located beneath the top surface 21a and connect the top surface 21a in the vertical direction. The conductive connection structure 25 connects the gate 27 and the sub-gate 27'; the conductive connection structure 25 is made of a conductor which can be formed by, for example but not limited to, metal lines and conductive plugs in a semiconductor manufacturing process, which is known to a person having ordinary skill in the art, so the details thereof are not redundantly explained here.

The "current channel" indicates: when the high voltage device 200 operates in ON operation, due to the voltage applied to the gate 27, an inversion layer is formed beneath the gate 27 so that a conduction current flows through the region of the inversion layer, and this region is the "current channel". "Current channel" is known to a person having ordinary skill in the art, so the details thereof are not redundantly explained here.

The "drift current channel" indicates: when the high voltage device 200 operates in ON operation, a conduction current flow through a region between the gate and drain (possibly including a portion under the gate) in a drifting manner. "Drift current channel" is known to a person having ordinary skill in the art, so the details thereof are not redundantly explained here.

Note that the top surface 21a as defined in the context of this invention does not mean a completely flat plane but refers to a surface of the semiconductor layer 21'. In the present embodiment, for example, where the top surface 21a is in contact with the drift oxide region 24 is recessed.

Note that the gate 27 as defined in the context of this invention includes a gate conductive layer, a gate dielectric layer connecting the top surface, and a gate spacer layer which is electrically insulative, which is known to a person having ordinary skill in the art, so the details thereof are not redundantly explained here.

The above-mentioned "first conductivity type" and "second conductivity type" indicate different conductivity types of impurities which are doped in regions or layers of the high voltage device (such as but not limited to the aforementioned well region, body region and source and the drain, etc.), so that the doped region or layer has the first or second conductivity type; the first conductivity type for example is N-type, and the second conductivity type is P-type, or the opposite.

In addition, a high voltage device, in the context of this invention, refers to a device whose drain is capable of receiving a voltage which is higher than a high voltage, such as higher than 5V, during a normal operation. Depending on the voltage that the high voltage device requires to withstand, a lateral distance (drift distance) between the body region 26 and the drain 29 can be adjusted accordingly, to meet the requirement, which is known to a person having ordinary skill in the art, so the details thereof are not redundantly explained here.

One feature of the present invention which is superior to the prior art is in that: taking the embodiment shown in FIGS. 2A and 2B as an example, since at least one sub-gate 27' is formed in the drift oxide region 24 and arranged in parallel with the gate 27, when the high voltage device 200 is OFF, there is a a relatively higher electric field along the edge in the width direction of each sub-gate 27', so that the voltage obtained by integrating the electric field along the channel is higher. That is, the voltage is higher during OFF operation, and thus the breakdown voltage is higher than the prior art during OFF operation.

In a preferable embodiment, as shown in FIGS. 2A and 2B, the sub-gate 27' and the gate 27 are indirectly connected to each other by the conductive connection structure 25 without being directly connected to each other. In a preferable embodiment, as shown in FIGS. 2A and 2B, the sub-gate 27' includes a sub-gate conductive layer 271 and a sub-gate spacer layer 272. In a preferable embodiment, as shown in FIGS. 2A and 2B, the drift oxide region 24 is a one-piece structure and is not divided into different separate sections.

Figure 3A:
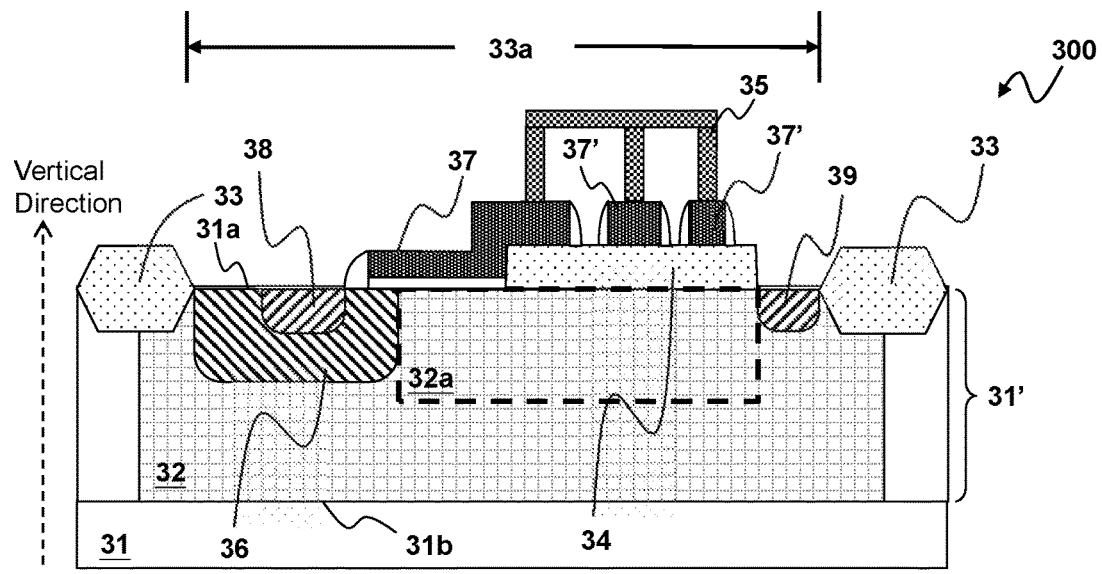
FIGS. 3A and 3B show a second embodiment of the present invention.
Figure 3B:
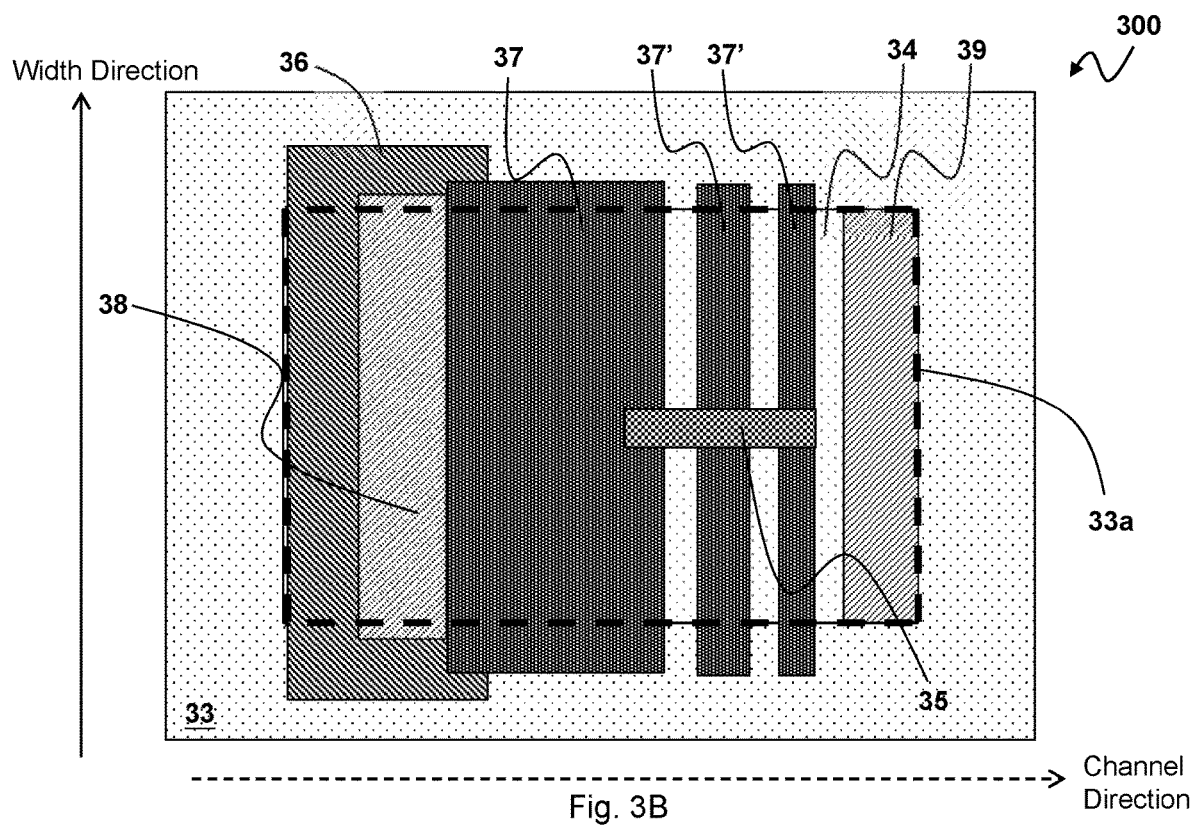

Please refer to FIGS. 3A and 3B, which show a second embodiment of the present invention. FIGS. 3A and 3B show a cross-sectional view and a top view, respectively, of a high voltage device 300. As shown in FIGS. 3A and 3B, the high voltage device 300 includes a semiconductor layer 31', a well region 32, an isolation structure 33, a drift oxide region 34, a conductive connection structure 35, a body region 36, a gate 37, at least one sub-gate 37', a source 38 and a drain 39. The semiconductor layer 31' is formed on the substrate 31 and has a top surface 31a and a bottom surface 31b opposite to the top surface 31a in the vertical direction (as indicated by the direction of dashed arrow in FIG. 3A). The substrate 31 is, for example, a P-type or N-type semiconductor silicon substrate. The semiconductor layer 31', for example, is formed on the substrate 31 by epitaxy, or, a part of the substrate 31 is used to form the semiconductor layer 31'. The semiconductor layer 31' can be formed by various methods known to a person having ordinary skill in the art, so the details thereof are not redundantly explained here.

Still referring to FIGS. 3A and 3B, the isolation structure 33 is formed on the top surface 31a and connects the top surface 31a for defining an operation region 33a (as indicated by the direction of the dashed arrow in FIG. 3B). The isolation structure 33 is not limited to the LOCOS structure as shown in the figure, and may be an STI structure. The drift oxide region 34 is formed on the top surface 31a and connects the top surface 31a, and is located on the drift region 32a of the operation region 33a (shown by the dashed line in FIG. 3A) and connects the drift region 32a.

The well region 32 which has the first conductivity type is formed in the operation region 33a of the semiconductor layer 31', and the well region 32 is located beneath the top surface 31a and connects the top surface 31a in the vertical direction. The body region 36 which has the second conductivity type is formed in the well region 32 of the operation region 33a, and the body region 36 is located beneath the top surface 31a and connects the top surface 31a in the vertical direction. The gate 37 is formed on the top surface 31a in the operation region 33a of the semiconductor layer 31'. From top view, the gate 37 is substantially a rectangle shape extending along the width direction (as indicated by the direction of the solid arrow in FIG. 3B), wherein a portion of the body region 36 is located below the gate 37 and connects the gate 37 in the vertical direction to serve as a current channel of the high voltage device 300 during ON operation.

Still referring to FIGS. 3A and 3B, the sub-gate 37' is formed on drift oxide region 34 in the operating region 33a. From the top view of FIG. 3B, the sub-gate 37' has a substantially rectangle shape and extends in the width direction in parallel with the gate 37. The sub-gate 37' is located on the drift oxide region 34 and connects the drift oxide region 34 in the vertical direction. In the present embodiment, the high voltage device 300 includes two sub-gates 37' as an illustrative example. The high voltage device of the present invention may include one or plural sub-gates.

The source 38 and the drain 39 have the first conductivity type. The source 38 and the drain 39 are formed beneath the top surface 31a and connect the top surface 31a of the operation region 33a in the vertical direction, and the source 38 and the drain 39 are located below the gate 37 respectively at two sides of the gate in the channel direction (as indicated by the direction of the dashed arrow in FIG. 3B); the source 38 is located in the body region 36, and the drain 39 is located in the well region 32 and away from the body region 36. The drift region 32a is located between the drain 39 and the body region 36 in the channel direction, in the well region 32 near the top surface 31a in the vertical direction, to serve as a drift current channel of the high voltage device 300 during ON operation. From the top view of FIG. 3B, the sub-gate 37' is between the gate 37 and the drain 39 in the channel direction, and the source 38 and the drain 39 are located beneath the top surface 31a and connect the top surface 31a in the vertical direction. The conductive connection structure 35 is formed on the gate 37 and the sub-gate 37' and electrically connects the gate 37 and the sub-gate 37'. The conductive connection structure 35 is made of a conductor which can be formed by, for example but not limited to, metal lines and conductive plugs in a semiconductor manufacturing process, which is known to a person having ordinary skill in the art, so the details thereof are not redundantly explained here.

This embodiment differs from the first embodiment in that, in the first embodiment, the drift oxide region 24 is formed by LOCOS, but in the present embodiment, the drift oxide region 34 is formed by chemical vapor deposition (CVD). A CVD process is well known to a person having ordinary skill in the art, so the details thereof are not redundantly explained here.

Figure 4A:
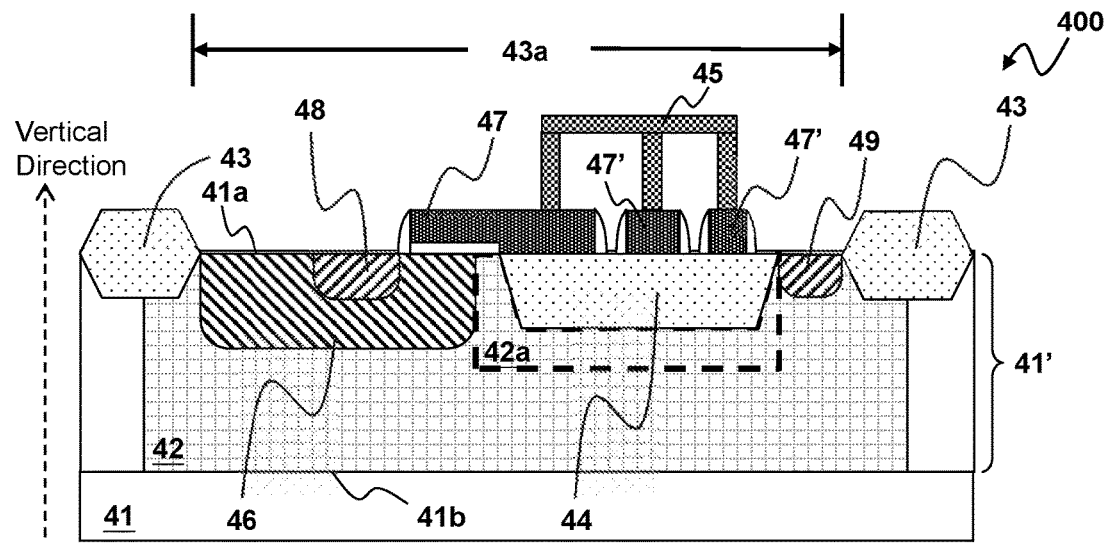
FIGS. 4A and 4B show a third embodiment of the present invention.
Figure 4B:
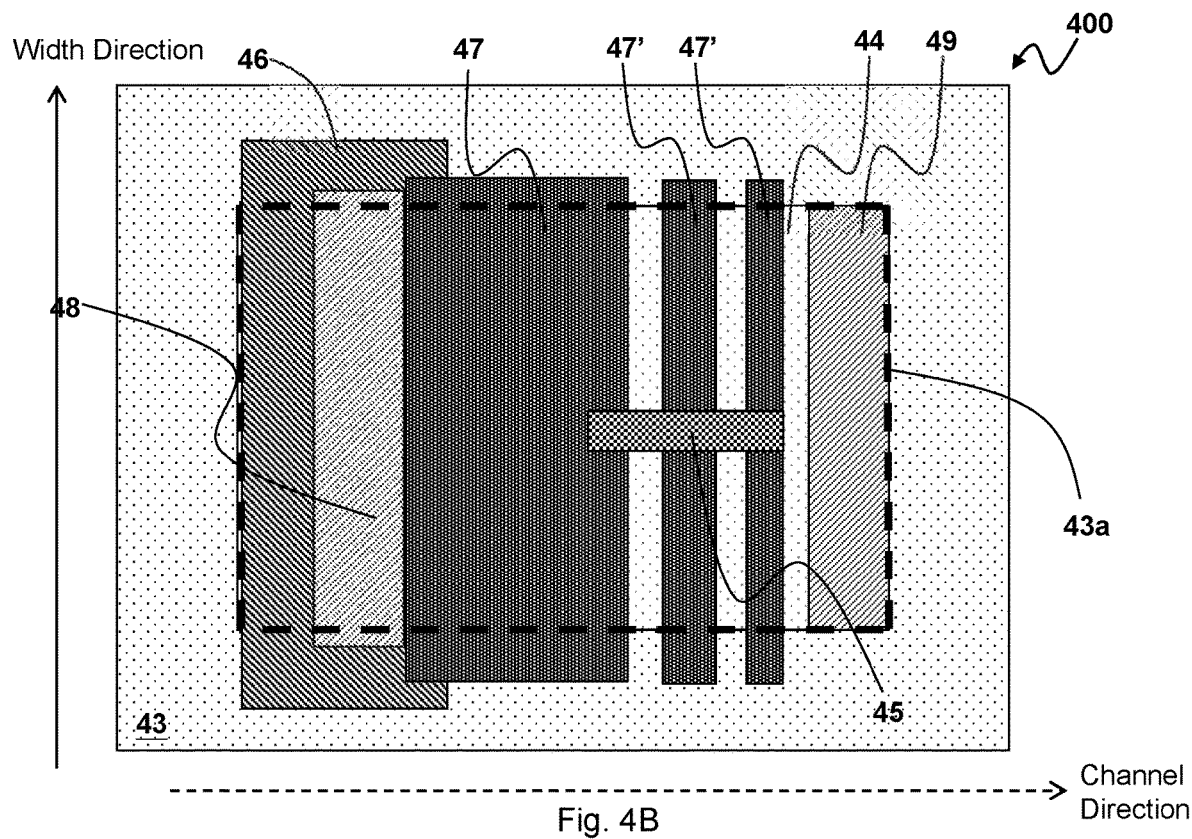

Please refer to FIGS. 4A and 4B, which show a third embodiment of the present invention. FIGS. 4A and 4B show a cross-sectional view and a top view, respectively, of a high voltage device 400. As shown in FIGS. 4A and 4B, the high voltage device 400 includes a semiconductor layer 41', a well region 42, an isolation structure 43, a drift oxide region 44, a conductive connection structure 45, a body region 46, a gate 47, at least one substrate 47', a source 48 and a drain 49. The semiconductor layer 41' is formed on the substrate 41, and the semiconductor layer 41' has a top surface 41a and a bottom surface 41b opposite to the top surface 41a in the vertical direction (as indicated by the direction of the dashed arrow in FIG. 4A). The substrate 41 is, for example, a P-type or N-type semiconductor silicon substrate. The semiconductor layer 41', for example, is formed on the substrate 41 by epitaxy, or, a part of the substrate 41 is used to form the semiconductor layer 41'. The semiconductor layer 41' can be formed by various methods known to a person having ordinary skill in the art, so the details thereof are not redundantly explained here.

Still referring to FIGS. 4A and 4B, the isolation structure 43 is formed on the top surface 41a and connects the top surface 41a for defining an operation area 43a (as indicated by the dashed line in FIG. 4B). The isolation structure 43 is not limited to the LOCOS structure as shown in the figure, and may be an STI structure. The drift oxide region 44 is formed on the top surface 41a and connects the top surface 41a, and is located on the drift region 42a (shown by the dashed line in FIG. 4A) in the operation region 43a and connects the drift region 42a.

The well region 42 which has the first conductivity type is formed in the operation region 43a of the semiconductor layer 41', and the well region 42 is located beneath the top surface 41a and connects the top surface 41a in the vertical direction. The body region 46 which has the second conductivity type is formed in the well region 42 of the operation region 43a, and the body region 46 is located beneath the top surface 41a and connects the top surface 41a in the vertical direction. The gate 47 is formed on the top surface 41a in the operation region 43a of the semiconductor layer 41'. From top view, the gate 47 is substantially a rectangle shape extending along the width direction (as indicated by the direction of the solid arrow in FIG. 4B), wherein a portion of the body region 46 is located below the gate 47 and connects the gate 47 in the vertical direction to provide a current channel of the high voltage device 400 during ON operation.

Still referring to FIGS. 4A and 4B, the sub-gate 47' is formed on drift oxide region 44 in the operating region 43a. From the top view of FIG. 4B, the sub-gate 47' has a substantially rectangle shape and extends in the width direction in parallel with the gate 47. The sub-gate 47' is located on the drift oxide region 44 and connects the drift oxide region 44 in the vertical direction. In the present embodiment, the high voltage device 400 includes two sub-gates 47' as an illustrative example. The high voltage device of the present invention may include one or plural sub-gates.

The source 48 and the drain 49 have the first conductivity type. The source 48 and the drain 49 are formed beneath the top surface 41a and connect the top surface 41a of the operation region 43a in the vertical direction, and the source 48 and the drain 49 are located below the gate 47 respectively at two sides of the gate in the channel direction (as indicated by the direction of the dashed arrow in FIG. 4B); the source 48 is located in the body region 46, and the drain 49 is located in the well region 42 and away from the body region 46. The drift region 42a is located between the drain 49 and the body region 46 in the channel direction, in the well region 42 near the top surface 41a in the vertical direction, to serve as a drift current channel of the high voltage device 400 during ON operation. From the top view of FIG. 4B, the sub-gate 47' is between the gate 47 and the drain 49 in the channel direction, and the source 48 and the drain 49 are located beneath the top surface 41a and connect the top surface 41a in the vertical direction. The conductive connection structure 45 is formed on the gate 47 and the sub-gate 47' and electrically connects the gate 47 and the sub-gate 47'. The conductive connection structure 45 is made of a conductor which can be formed by, for example but not limited to, metal lines and conductive plugs in a semiconductor manufacturing process, which is known to a person having ordinary skill in the art, so the details thereof are not redundantly explained here.

This embodiment differs from the first embodiment in that, in the first embodiment, the drift oxide region 24 is a LOCOS structure, but in the present embodiment, the drift oxide region 44 is an STI structure. The STI structure is known to a person having ordinary skill in the art, so the details thereof are not redundantly explained here.

Figure 5A:
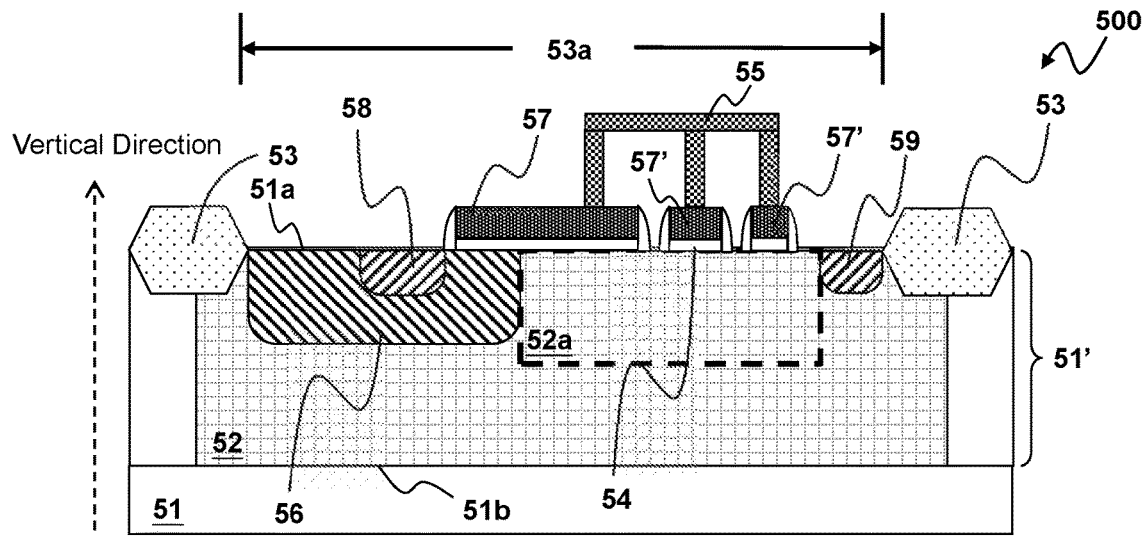
FIGS. 5A and 5B show a fourth embodiment of the present invention.
Figure 5B:
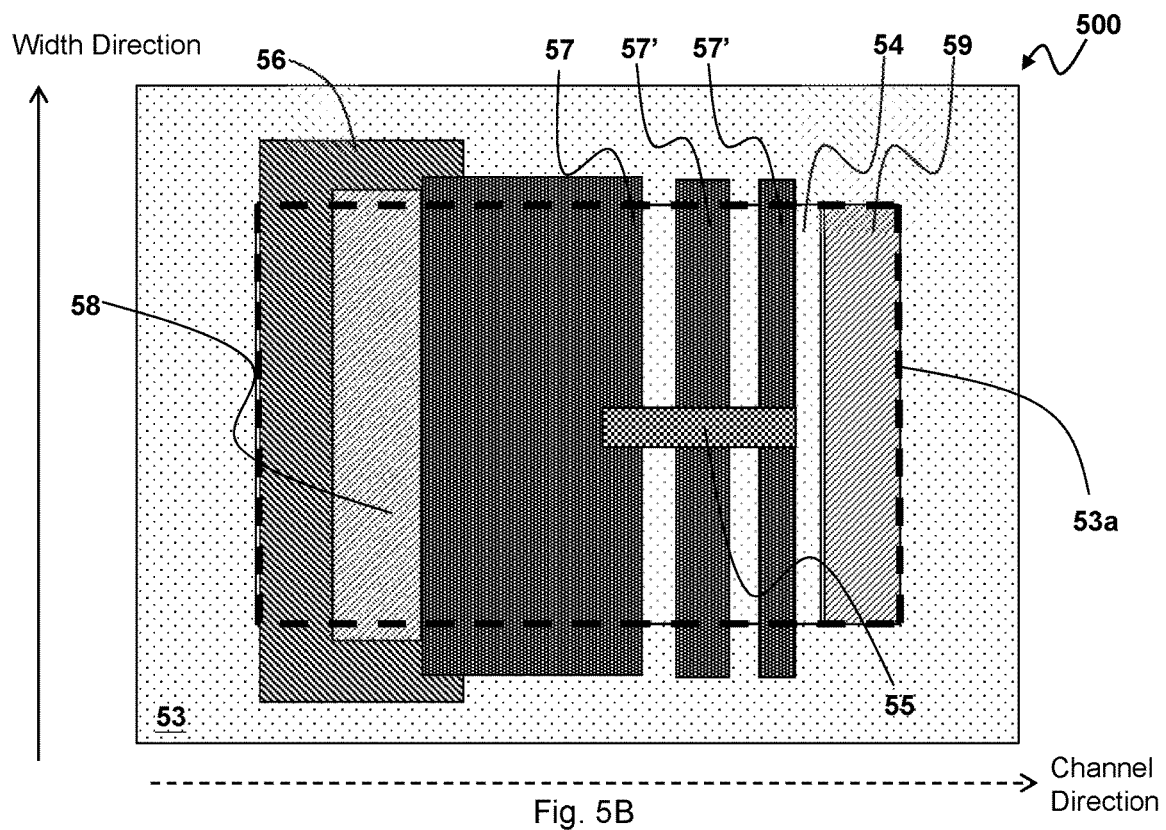

Please refer to FIGS. 5A and 5B, which show a fourth embodiment of the present invention. FIGS. 5A and 5B respectively show a cross-sectional view and a top view of a high voltage device 500. The high voltage device 500 includes a semiconductor layer 51', a well region 52, an isolation structure 53, a drift oxide region 54, a conductive connection structure 55, a body region 56, a gate 57, at least one sub-gate 57', a source 58, and a drain 59. The semiconductor layer 51' is formed on the substrate 51, and the semiconductor layer 51' has a top surface 51a and a bottom surface 51b opposite to the top surface 51a in the vertical direction (as indicated by the direction of the dashed arrow in FIG. 5A). The substrate 51 is, for example, a P-type or N-type semiconductor silicon substrate. The semiconductor layer 51', for example, is formed on the substrate 51 by epitaxy, or, a part of the substrate 51 is used to form the semiconductor layer 51'. The semiconductor layer 51' can be formed by various methods known to a person having ordinary skill in the art, so the details thereof are not redundantly explained here.

Still referring to FIGS. 5A and 5B, the isolation structure 53 is formed on the top surface 51a and connects the top surface 51a for defining an operation region 53a (as indicated by the dashed line in FIG. 5B). The isolation structure 53 is not limited to the LOCOS structure as shown in the figure, and may instead be an STI structure. The drift oxide region 54 is formed on the top surface 51a and connects the top surface 51a, and is located on the drift region 52a (as indicated by the dashed line in FIG. 5A) in the operation region 53a and connects the drift region 52a.

The well region 52 which has the first conductivity type is formed in the operation region 53a of the semiconductor layer 51', and the well region 52 is located beneath the top surface 51a and connects the top surface 51a in the vertical direction. The body region 56 which has the second conductivity type is formed in the well region 52 of the operation region 53a, and the body region 56 is located beneath the top surface 51a and connects the top surface 51a in the vertical direction. The gate 57 is formed on the top surface 51a in the operation region 53a of the semiconductor layer 51'. From top view, the gate 57 is substantially a rectangle shape extending along the width direction (as indicated by the direction of the solid arrow in FIG. 5B), wherein a portion of the body region 56 is located below the gate 57 and connects the gate 57 in the vertical direction to provide a current channel of the high voltage device 500 during ON operation.

Still referring to FIGS. 5A and 5B, the sub-gate 57' is formed on drift oxide region 54 in the operating region 53a. From the top view of FIG. 5B, the sub-gate 57' has a substantially rectangle shape and extends in the width direction in parallel with the gate 57. The sub-gate 57' is located on the drift oxide region 54 and connects the drift oxide region 54 in the vertical direction. In the present embodiment, the high voltage device 500 includes two sub-gates 57' as an illustrative example. The high voltage device of the present invention may include one or plural sub-gates.

The source 58 and the drain 59 have the first conductivity type. The source 58 and the drain 59 are formed beneath the top surface 51a and connect the top surface 51a of the operation region 53a in the vertical direction, and the source 58 and the drain 59 are located below the gate 57 respectively at two sides of the gate in the channel direction (as indicated by the direction of the dashed arrow in FIG. 5B); the source 58 is located in the body region 56, and the drain 59 is located in the well region 52 and away from the body region 56. The drift region 52a is located between the drain 59 and the body region 56 in the channel direction, in the well region 52 near the top surface 51a in the vertical direction, to serve as a drift current channel of the high voltage device 500 during ON operation. From the top view of FIG. 5B, the sub-gate 57' is between the gate 57 and the drain 59 in the channel direction, and the source 58 and the drain 59 are located beneath the top surface 51a and connect the top surface 51a in the vertical direction. The conductive connection structure 55 is formed on the gate 57 and the sub-gate 57' and electrically connects the gate 57 and the sub-gate 57'. The conductive connection structure 55 is made of a conductor which can be formed by, for example but not limited to, metal lines and conductive plugs in a semiconductor manufacturing process, which is known to a person having ordinary skill in the art, so the details thereof are not redundantly explained here.

This embodiment differs from the first embodiment in that, in the first embodiment, the drift oxide region 24 is a LOCOS structure, but in the present embodiment, the drift oxide region 54 is formed by a part of a gate oxide layer. The gate oxide layer is for forming the gate dielectric layer of the gate 57, which is well known to a person having ordinary skill in the art, so the details thereof are not redundantly explained here; the drift oxide region 54 can be formed by the same oxidation step when forming the gate dielectric layer of the gate 57.

Figure 6A:
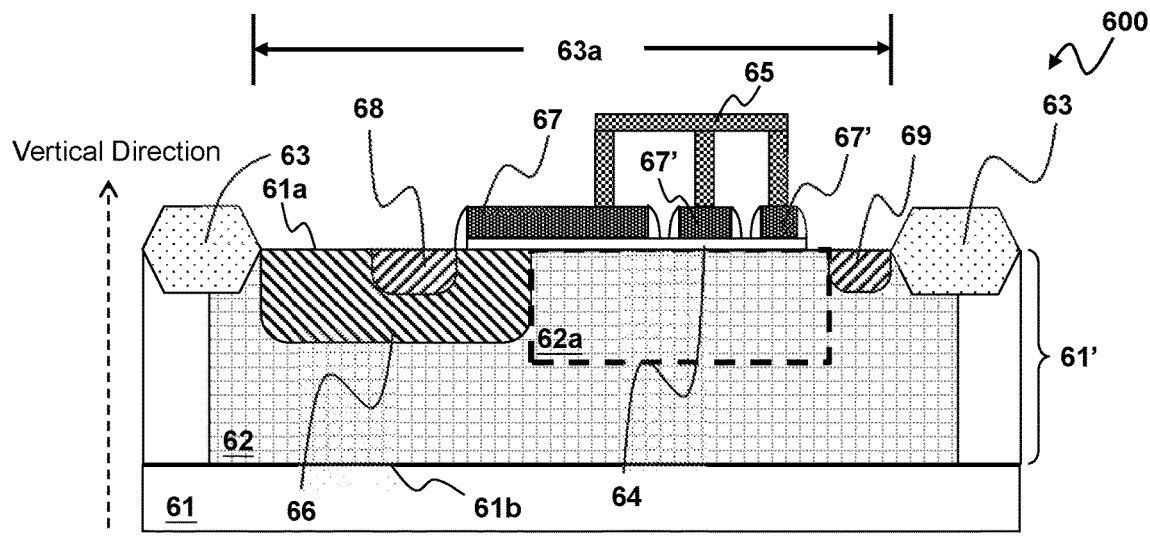
FIGS. 6A and 6B show a fifth embodiment of the present invention.
Figure 6B:
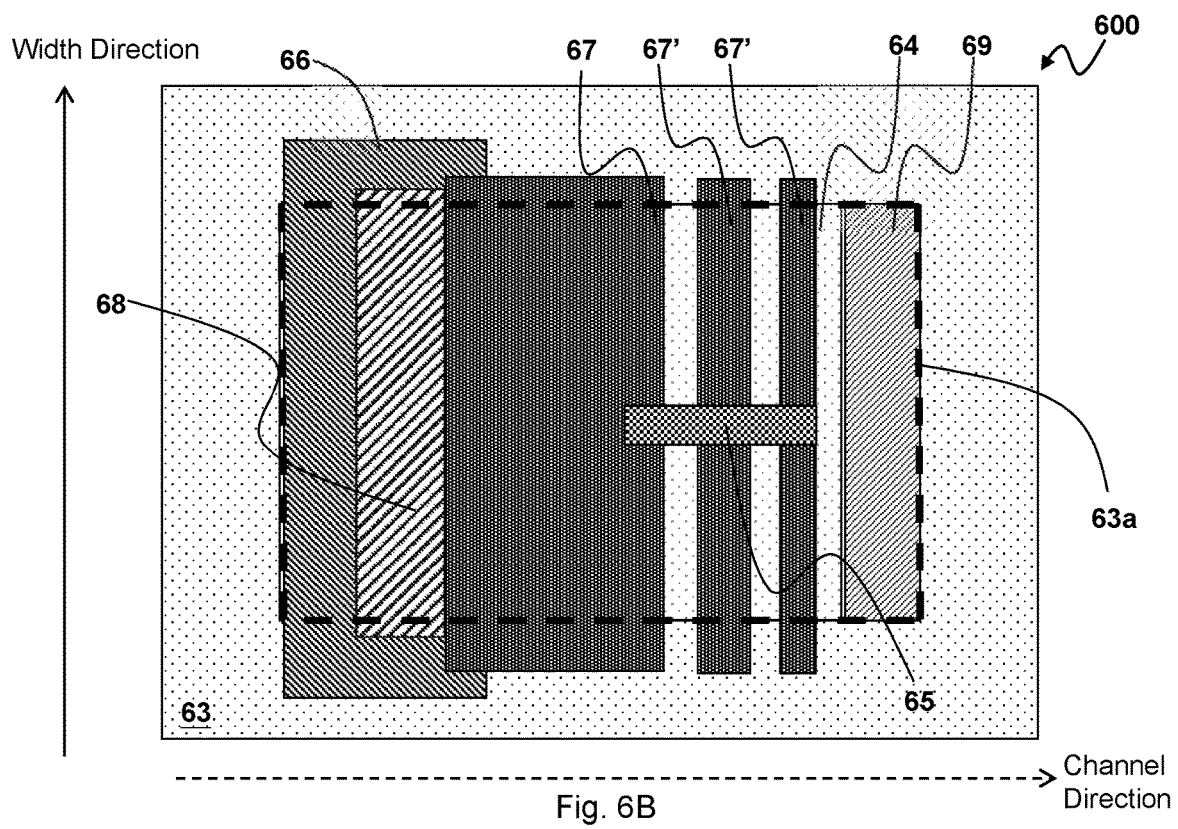

Please refer to FIGS. 6A and 6B, which show a fifth embodiment of the present invention. FIGS. 6A and 6B respectively show a cross-sectional view and a top view of a high voltage device 600. The high voltage device 600 includes a semiconductor layer 61', a well region 62, an isolation structure 63, a drift oxide region 64, a conductive connection structure 65, a body region 66, a gate 67, at least one sub-gate 67', a source 68, and a drain 69. The semiconductor layer 61' is formed on the substrate 61, and the semiconductor layer 61' has a top surface 61a and a bottom surface 61b opposite to the top surface 61a in the vertical direction (as indicated by the direction of the dashed arrow in FIG. 6A). The substrate 61 is, for example, a P-type or N-type semiconductor silicon substrate. The semiconductor layer 61', for example, is formed on the substrate 61 by epitaxy, or, a part of the substrate 61 is used to form the semiconductor layer 61'. The semiconductor layer 61' can be formed by various methods known to a person having ordinary skill in the art, so the details thereof are not redundantly explained here.

Still referring to FIGS. 6A and 6B, the isolation structure 63 is formed on the top surface 61a and connects the top surface 61a for defining an operation region 63a (as indicated by the dashed line in FIG. 6B). The isolation structure 63 is not limited to the LOCOS structure as shown in the figure, and may instead be an STI structure. The drift oxide region 64 is formed on the top surface 61a and connects the top surface 21a, and is located on the drift region 62a (as indicated by the dashed line in FIG. 6A) in the operation region 63a and connects the drift region 62a.

The well region 62 which has the first conductivity type is formed in the operation region 63a of the semiconductor layer 61', and the well region 62 is located beneath the top surface 61a and connects the top surface 61a in the vertical direction. The body region 66 which has the second conductivity type is formed in the well region 62 of the operation region 53a, and is located beneath the top surface 61a and connects the top surface 61a in the vertical direction. The gate 67 is formed on the top surface 61a in the operation region 63a of the semiconductor layer 61'. From top view, the gate 67 is substantially a rectangle shape extending along the width direction (as indicated by the direction of the solid arrow in FIG. 6B), and a portion of the body region 66 is located below the gate 67 and connects the gate 57 in the vertical direction to provide a current channel of the high voltage device 600 during ON operation.

Still referring to FIGS. 6A and 6B, the sub-gate 67' is formed on drift oxide region 64 in the operating region 63a. From the top view of FIG. 6B, the sub-gate 67' has a substantially rectangle shape and extends in the width direction in parallel with the gate 67. The sub-gate 67' is located on the drift oxide region 64 and connects the drift oxide region 64 in the vertical direction. In the present embodiment, the high voltage device 600 includes two sub-gates 67' as an illustrative example. The high voltage device of the present invention may include one or plural sub-gates.

The source 68 and the drain 69 have the first conductivity type. The source 68 and the drain 69 are formed beneath the top surface 61a and connect the top surface 61a of the operation region 63a in the vertical direction, and the source 68 and the drain 69 are located below the gate 67 respectively at two sides of the gate in the channel direction (as indicated by the direction of the dashed arrow in FIG. 6B); the source 68 is located in the body region 66, and the drain 69 is located in the well region 62 and away from the body region 66. The drift region 62a is located between the drain 69 and the body region 66 in the channel direction, in the well region 62 near the top surface 61a in the vertical direction, to serve as a drift current channel of the high voltage device 600 during ON operation. From the top view of FIG. 6B, the sub-gate 67' is between the gate 67 and the drain 69 in the channel direction, and the source 68 and the drain 69 are located beneath the top surface 61a and connect the top surface 61a in the vertical direction. The conductive connection structure 65 is formed on the gate 67 and the sub-gate 67' and electrically connects the gate 67 and the sub-gate 67'. The conductive connection structure 65 is made of a conductor which can be formed by, for example but not limited to, metal lines and conductive plugs in a semiconductor manufacturing process, which is known to a person having ordinary skill in the art, so the details thereof are not redundantly explained here.

This embodiment differs from the first embodiment in that, in the first embodiment, the drift oxide region 24 is a LOCOS structure, but in the present embodiment, the drift oxide region 64 is formed by a part of a gate oxide layer. In addition, the drift oxide region 64 is a one-piece structure in the present embodiment, which differs from the drift oxide region 54 in the fourth embodiment wherein the drift oxide region 54 is divided into several separate sections. The drift oxide region 64 can be formed by the same oxidation step when forming the gate dielectric layer of the gate 67.

Figure 7A:
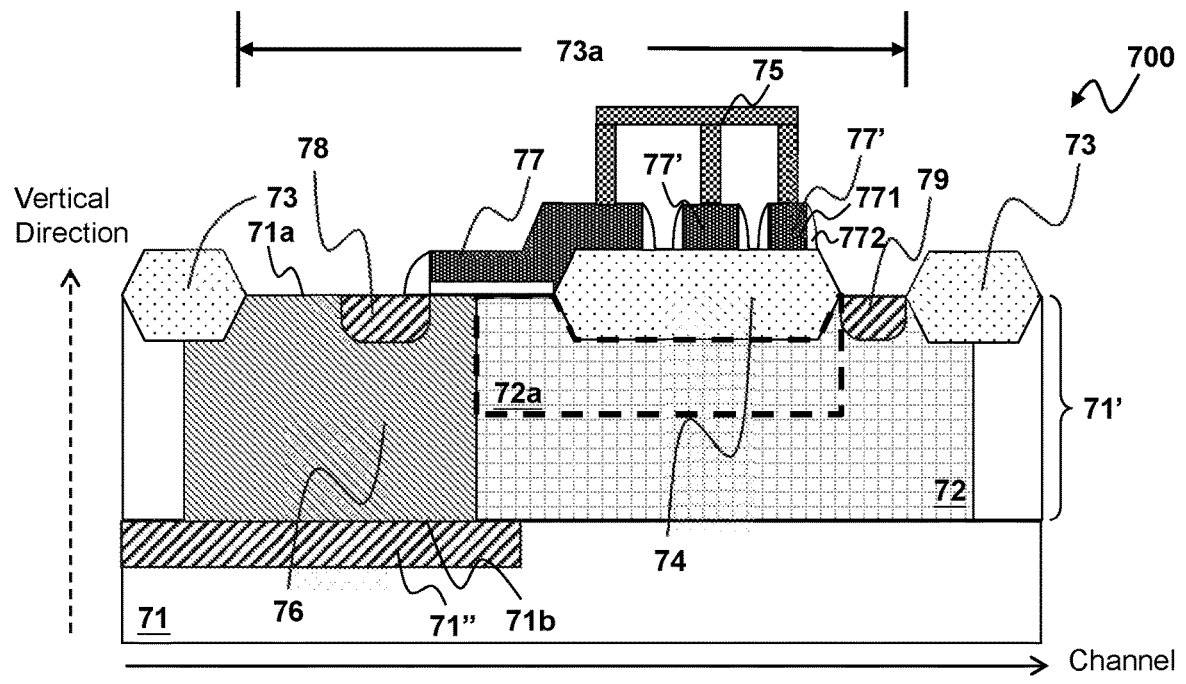
FIGS. 7A and 7B show a sixth embodiment of the present invention.
Figure 7B:
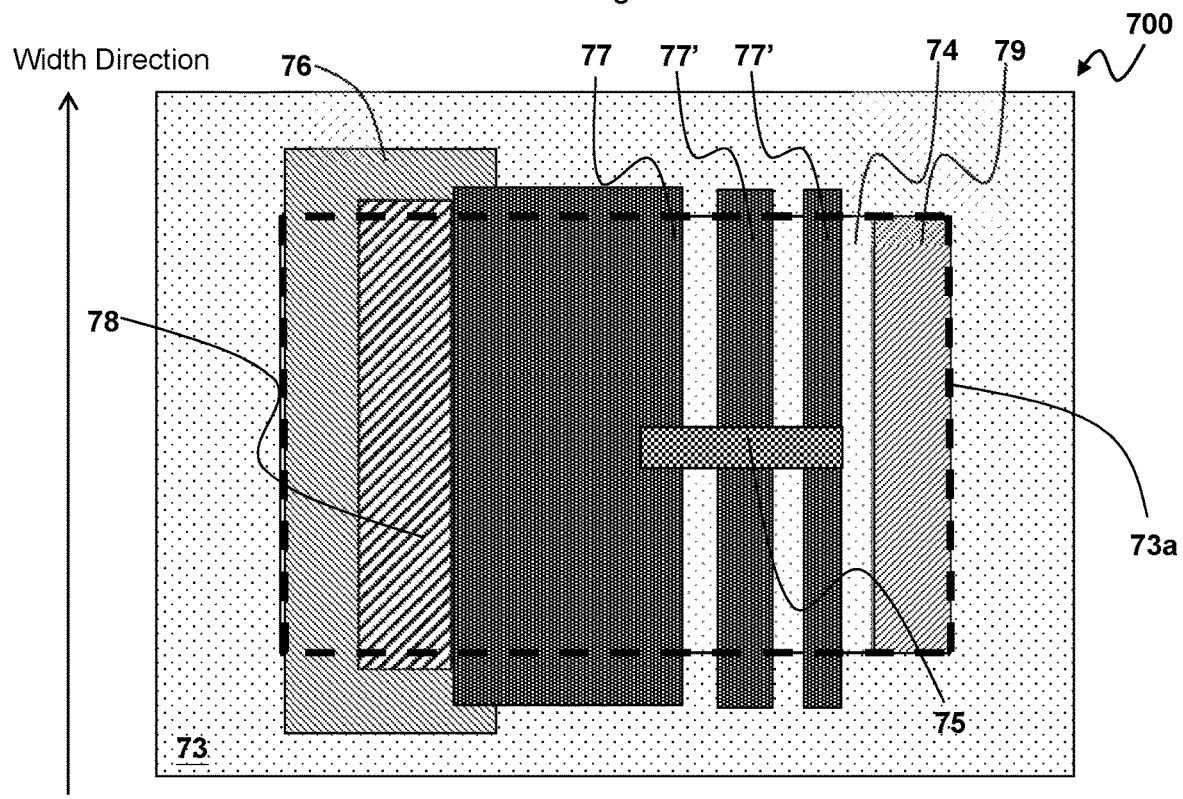

Please refer to FIGS. 7A and 7B, which show a sixth embodiment of the present invention. FIGS. 7A and 7B respectively show a cross-sectional view and a top view of a high voltage device 700. As shown in FIGS. 7A and 7B, the high voltage device 700 includes a semiconductor layer 71', a buried layer 71", a drift well 72, an isolation structure 73, a drift oxide region 74, a conductive connection structure 75, a channel well region 76, a gate 77, at least one sub-gate 77', a source 78, and a drain 79. The semiconductor layer 71' is formed on the substrate 71, and the semiconductor layer 71' has a top surface 71*a* and a bottom surface 71*b* opposite to the top surface 71*a* in the vertical direction (as indicated by the direction of the dashed arrow in FIG. 7A). The substrate 71 is, for example, a P-type or N-type semiconductor silicon substrate. The semiconductor layer 71', for example, is formed on the substrate 71 by epitaxy, or, a part of the substrate 71 is used to form the semiconductor layer 71'. The semiconductor layer 71' can be formed by various methods known to a person having ordinary skill in the art, so the details thereof are not redundantly explained here.

Still referring to FIGS. 7A and 7B, the isolation structure 73 is formed on the top surface 71*a* and connects the top surface 71*a* for defining an operation region 73*a* (as indicated by the dashed line in FIG. 7B). The isolation structure 73 is not limited to the LOCOS structure as shown in the figure, and may instead be an STI structure. The drift oxide region 74 is formed on the top surface 71*a* and connects the top surface 71*a*, and is located on the drift region 72*a* (as indicated by the dashed line in FIG. 7A) in the operation region 73*a* and connects the drift region 72*a*.

The drift well region 72 which has the first conductivity type is formed in the operation region 73*a* of the semiconductor layer 71', and the drift well region 72 is located beneath the top surface 71*a* and connects the top surface 71*a* in the vertical direction. The channel well region 76 which has the second conductivity type is formed beneath the top surface 61*a* in the operation region 73*a*, and the channel well region 76 is located beneath the top surface 61*a* and connects the top surface 71*a* in the vertical direction. The gate 77 is formed on the top surface 71*a* in the operation region 73*a* of the semiconductor layer 71'. From top view, the gate 77 is substantially a rectangle shape extending along the width direction (as indicated by the direction of the solid arrow in FIG. 7B), wherein a portion of the channel well region 76 is located below the gate 77 and connects the gate 77 in the vertical direction to provide a current channel of the high voltage device 700 during ON operation.

Still referring to FIGS. 7A and 7B, the sub-gate 77' is formed on drift oxide region 74 in the operation region 73*a*. From the top view of FIG. 7B, the sub-gate 77' has a substantially rectangle shape and extends in the width direction in parallel with the gate 77. The sub-gate 77' is located on the drift oxide region 74 and connects the drift oxide region 74 in the vertical direction. In the present embodiment, the high voltage device 700 includes two sub-gates 77' as an illustrative example. The high voltage device of the present invention may include one or plural sub-gates.

The source 78 and the drain 79 have the first conductivity type. The source 78 and the drain 79 are formed beneath the top surface 71*a* and connect the top surface 71*a* of the operation region 73*a* in the vertical direction, and the source 78 and the drain 79 are located below the gate 77 respectively at two sides of the gate in the channel direction (as indicated by the direction of the dashed arrow in FIG. 7B); the source 78 is located in the channel well region 76, and the drain 79 is located in the well region 72 and away from the channel well region 76. The drift region 72*a* is located between the drain 79 and the channel well region 76 in the channel direction, in the well region 72 near the top surface 71*a* in the vertical direction, to serve as a drift current channel of the high voltage device 700 during ON operation. From the top view of FIG. 7B, the sub-gate 77' is between the gate 77 and the drain 79 in the channel direction, and the source 78 and the drain 79 are located beneath the top surface 71*a* and connect the top surface 71*a* in the vertical direction. The conductive connection structure 75 is formed on the gate 77 and the sub-gate 77' and electrically connects the gate 77 and the sub-gate 77'. The conductive connection structure 75 is made of a conductor which can be formed by, for example but not limited to, metal lines and conductive plugs in a semiconductor manufacturing process, which is known to a person having ordinary skill in the art, so the details thereof are not redundantly explained here. The buried layer 71" which has the first conductivity type is formed beneath the channel well region 76 and connects the channel well region 76. The buried layer 71" in the operation region 73*a* completely covers the lower side of the channel well region 76. The buried layer 71" is, for example, formed on both sides of the junction surface between the substrate 71 and the semiconductor layer 71' in the vertical direction, i.e., a portion of the buried layer 71" is located in the substrate 71, and a portion of the buried layer 71" is located in the semiconductor layer 71'.

In a preferable embodiment, as shown in FIGS. 7A and 7B, the sub-gate 77' and the gate 77 are indirectly connected to each other by the conductive connection structure 75 without being directly connected to each other. In a preferable embodiment, as shown in FIGS. 7A and 7B, the sub-gate 77' includes a sub-gate conductive layer 771 and a sub-gate spacer layer 772. In a preferable embodiment, as shown in FIGS. 7A and 7B, the drift oxide region 74 is a one-piece structure and is not divided into different separate sections.

Figure 8A:
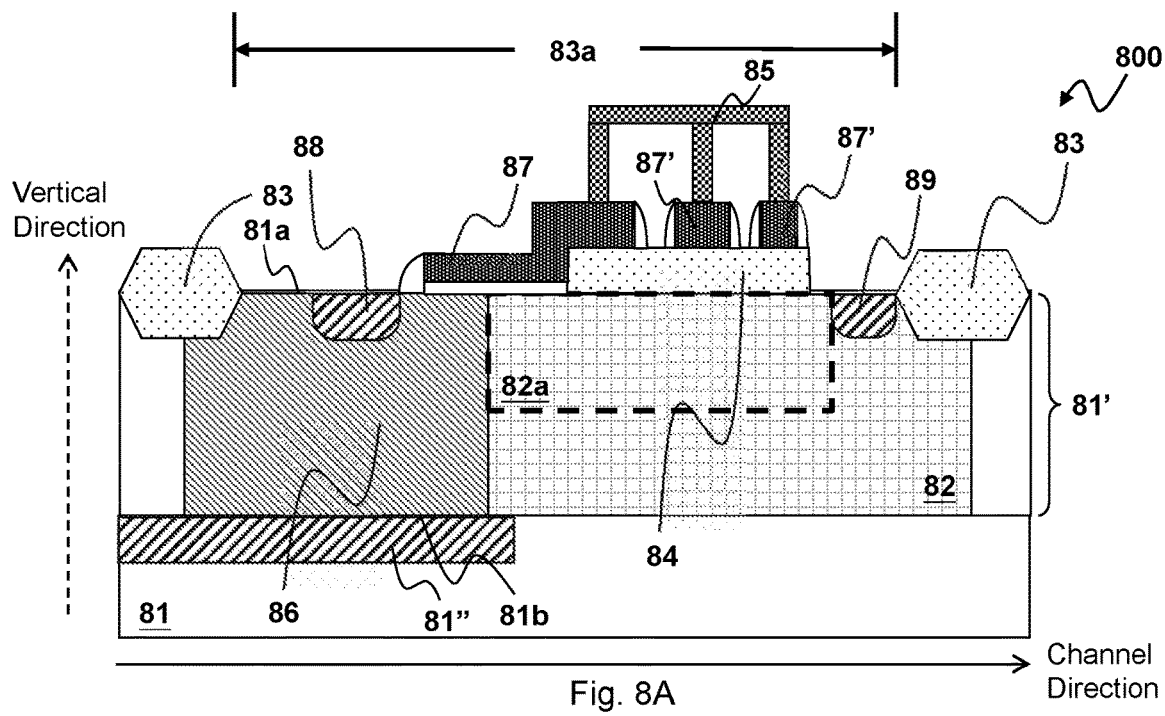
FIGS. 8A and 8B show a seventh embodiment of the present invention.
Figure 8B:
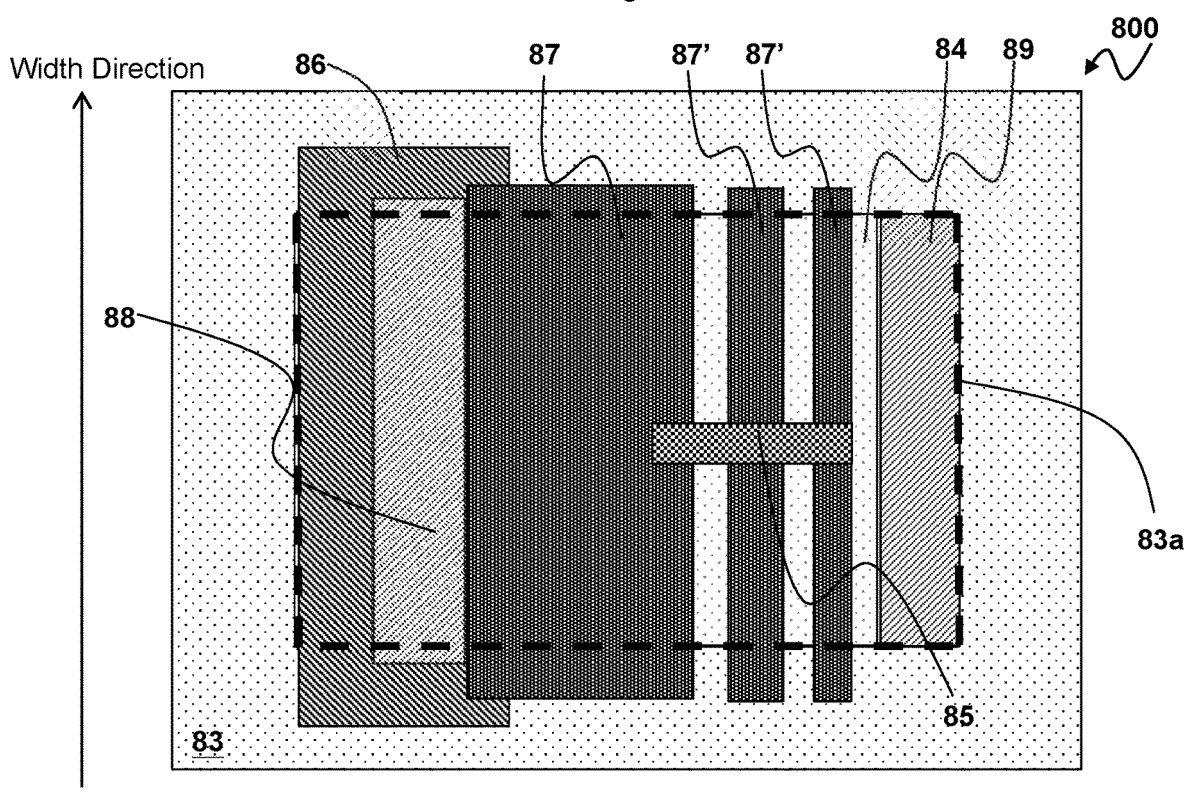

Please refer to FIGS. 8A and 8B, which show a seventh embodiment of the present invention. FIGS. 8A and 8B respectively show a cross-sectional view and a top view of a high voltage device 800. The high voltage device 800 includes a semiconductor layer 81', a buried layer 81", a drift well region 82, an isolation structure 83, a drift oxide region 84, a conductive connection structure 85, a channel well region 86, a gate 87, at least one sub-gate 87', a source 88, and a drain 89. The semiconductor layer 81' is formed on the substrate 81, and the semiconductor layer 81' has a top surface 81*a* and a bottom surface 81*b* opposite to the top surface 81*a* in the vertical direction (as indicated by the direction of the dashed arrow in FIG. 8A). The substrate 81 is, for example, a P-type or N-type semiconductor silicon substrate. The semiconductor layer 81', for example, is formed on the substrate 81 by epitaxy, or, a part of the substrate 81 is used to form the semiconductor layer 81'. The semiconductor layer 81' can be formed by various methods known to a person having ordinary skill in the art, so the details thereof are not redundantly explained here.

Still referring to FIGS. 8A and 8B, the isolation structure 83 is formed on the top surface 81a and connects the top surface 81a for defining an operation region 83a (as indicated by the dashed line in FIG. 8B). The isolation structure 83 is not limited to the LOCOS structure as shown in the figure, and may instead be an STI structure. The drift oxide region 84 is formed on the top surface 81a and connects the top surface 81a, and is located on the drift region 82a (as indicated by the dashed line in FIG. 8A) in the operation region 83a and connects the drift region 82a.

The drift well region 82 which has the first conductivity type is formed in the operation region 83a of the semiconductor layer 81', and the drift well region 82 is located beneath the top surface 81a and connects the top surface 81a in the vertical direction. The channel well region 86 which has the second conductivity type is formed beneath the top surface 81a in the operation region 83a, and connects the top surface 81a in the vertical direction. The channel well region 86 connects the drift well region 82 in the channel direction (as indicated by the direction of the solid arrow in FIG. 8A). The gate 87 is formed on the top surface 81a in the operation region 83a of the semiconductor layer 81'. From top view, the gate 87 is substantially a rectangle shape extending along the width direction (as indicated by the direction of the solid arrow in FIG. 8B), and a portion of the channel well region 86 is located below the gate 87 and connects the gate 87 in the vertical direction to provide a current channel of the high voltage device 800 during ON operation.

Still referring to FIGS. 8A and 8B, the sub-gate 87' is formed on the drift oxide region in the operation region 83a 84. From the top view of FIG. 8B, the sub-gate 87' has a substantially rectangle shape and extends in the width direction in parallel with the gate 87. The sub-gate 87' is located on the drift oxide region 84 and connects the drift oxide region 84 in the vertical direction. In the present embodiment, the high voltage device 800 includes two sub-gates 87' as an illustrative example. The high voltage device of the present invention may include one or plural sub-gates.

The source 88 and the drain 89 have the first conductivity type. The source 88 and the drain 89 are formed beneath the top surface 81a and connect the top surface 81a of the operation region 83a in the vertical direction, and the source 88 and the drain 89 are located below the gate 87 respectively at two sides of the gate in the channel direction (as indicated by the direction of the dashed arrow in FIG. 8B); the source 88 is located in the channel well region 86, and the drain 89 is located in the well region 82 and away from the channel well region 86. The drift region 82a is located between the drain 89 and the channel well region 86 in the channel direction, in the well region 82 near the top surface 81a in the vertical direction, to serve as a drift current channel of the high voltage device 800 during ON operation. From the top view of FIG. 8B, the sub-gate 87' is between the gate 88 and the drain 89 in the channel direction, and the source 88 and the drain 89 are located beneath the top surface 81a and connect the top surface 81a in the vertical direction. The conductive connection structure 85 is formed on the gate 87 and the sub-gate 87' and electrically connects the gate 87 and the sub-gate 87'. The conductive connection structure 85 is made of a conductor which can be formed by, for example but not limited to, metal lines and conductive plugs in a semiconductor manufacturing process, which is known to a person having ordinary skill in the art, so the details thereof are not redundantly explained here. The buried layer 81" which has the first conductivity type is formed beneath the channel well region 86 and connects the channel well region 86. The buried layer 81" in the operation region 83a completely covers the lower side of the channel well region 86. The buried layer 81" is, for example, formed on both sides of the junction surface between the substrate 81 and the semiconductor layer 81' in the vertical direction, i.e., a portion of the buried layer 81" is located in the substrate 81, and a portion of the buried layer 81" is located in the semiconductor layer 81'.

This embodiment differs from the sixth embodiment in that, in the sixth embodiment, the drift oxide region 74 is formed by LOCOS, but in the present embodiment, the drift oxide region 84 is formed by CVD. The CVD process is well known to a person having ordinary skill in the art, so the details thereof are not redundantly explained here.

Figure 9A:
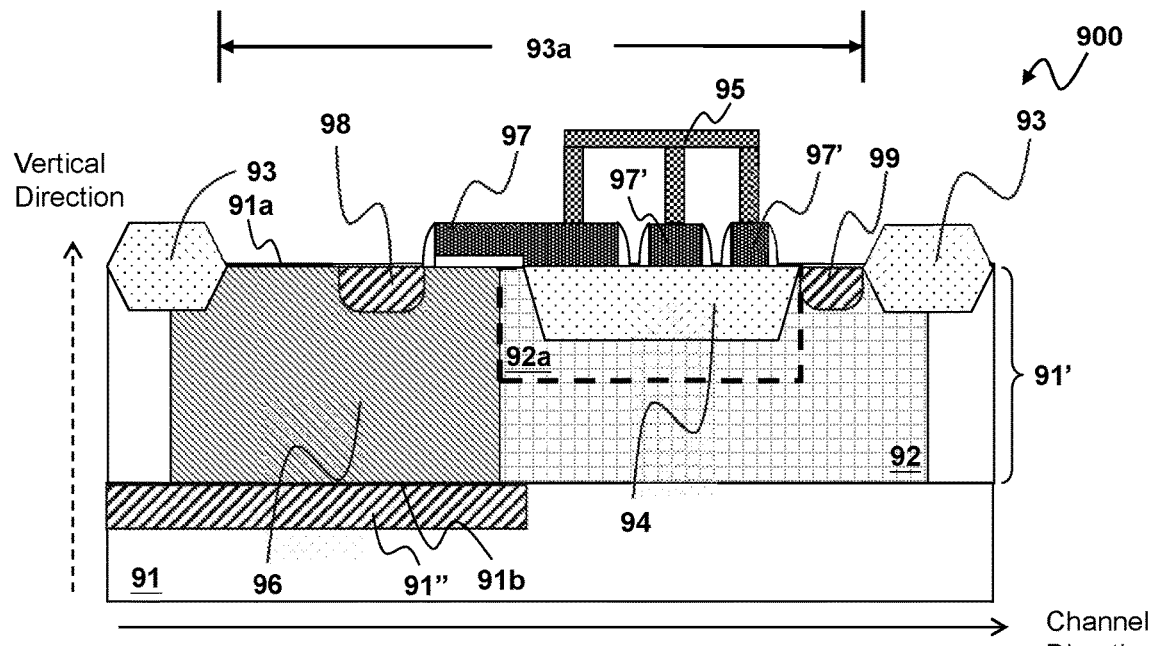
FIGS. 9A and 9B show an eighth embodiment of the present invention.
Figure 9B:
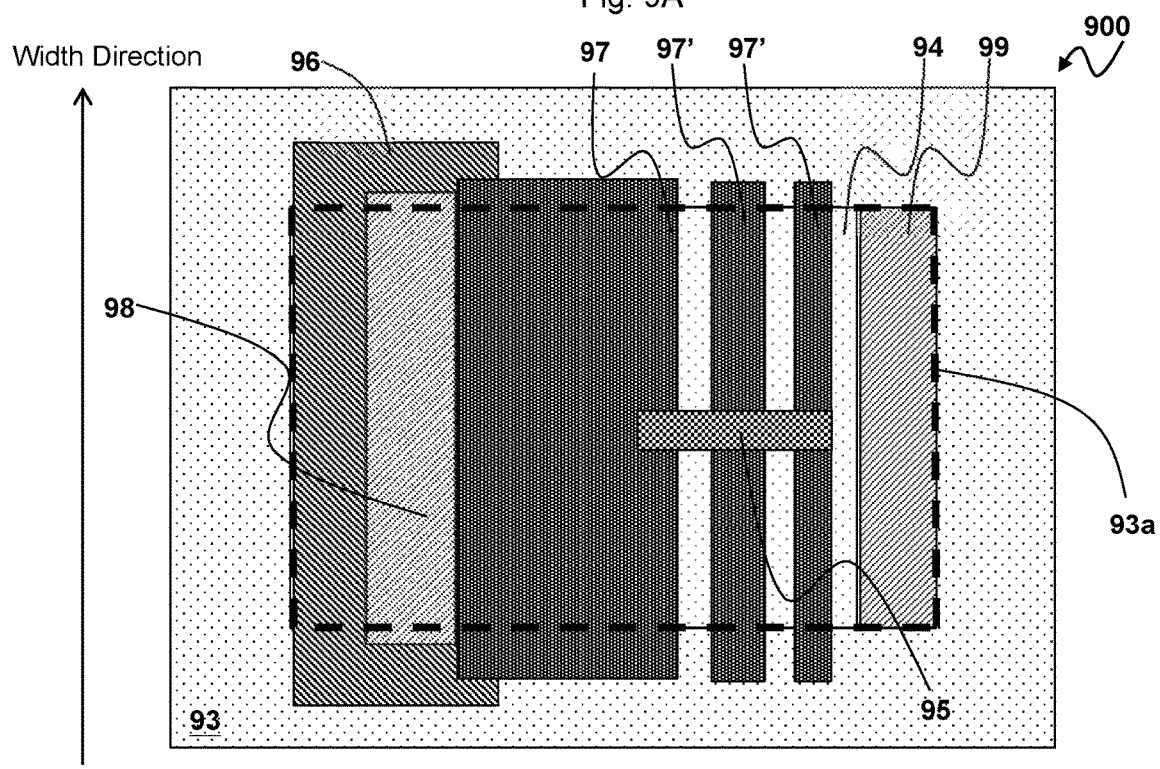

Please refer to FIGS. 9A and 9B, which show an eighth embodiment of the present invention. FIGS. 9A and 9B respectively show a cross-sectional view and a top view of a high voltage device 900. The high voltage device 900 includes a semiconductor layer 91', a buried layer 91", a drift well region 92, an isolation structure 93, a drift oxide region 94, a conductive connection structure 95, a channel well region 96, a gate 97, at least one sub-gate 97', a source 98, and a drain 99. The semiconductor layer 91' is formed on the substrate 91, and the semiconductor layer 91' has a top surface 91a and a bottom surface 91b opposite to the top surface 91a in the vertical direction (as indicated by the direction of the dashed arrow in FIG. 9A). The substrate 91 is, for example, a P-type or N-type semiconductor silicon substrate. The semiconductor layer 91', for example, is formed on the substrate 91 by epitaxy, or, a part of the substrate 91 is used to form the semiconductor layer 91'. The semiconductor layer 91' can be formed by various methods known to a person having ordinary skill in the art, so the details thereof are not redundantly explained here.

Still referring to FIGS. 9A and 9B, the isolation structure 93 is formed on the top surface 91a and connects the top surface 91a for defining an operation region 93a (as indicated by the dashed line in FIG. 9B). The isolation structure 93 is not limited to the LOCOS structure as shown in the figure, and may instead be an STI structure. The drift oxide region 94 is formed on the top surface 91a and connects the top surface 91a, and is located on the drift region 92a (as indicated by the dashed line in FIG. 9A) in the operation region 93a and connects the drift region 92a.

The drift well region 92 which has the first conductivity type is formed in the operation region 93a of the semiconductor layer 91', and the drift well region 92 is located beneath the top surface 91a and connects the top surface 91a in the vertical direction. The channel well region 96 which has the second conductivity type is formed beneath the top surface 91a in the operation region 93a and connects the top surface 91a in the vertical direction. The channel well region 96 connects the drift well region 92 in the channel direction (as indicated by the direction of the solid arrow in FIG. 9A). The gate 97 is formed on the top surface 91a in the operation region 93a of the semiconductor layer 91'. From top view, the gate 97 is substantially a rectangle shape extending along the width direction (as indicated by the direction of the solid arrow in FIG. 9B), wherein a portion of the channel well region 96 is located below the gate 97 and connects the gate 97 in the vertical direction to provide a current channel of the high voltage device 900 during ON operation.

Still referring to FIGS. 9A and 9B, the sub-gate 97' is formed on the drift oxide region 94 in the operation region 93a. From the top view of FIG. 9B, the sub-gate 97' has a substantially rectangle shape and extends in the width direction in parallel with the gate 97. The sub-gate 97' is located on the drift oxide region 94 and connects the drift oxide region 94 in the vertical direction. In the present embodiment, the high voltage device 900 includes two sub-gates 37' as an illustrative example. The high voltage device of the present invention may include one or plural sub-gates.

The source 98 and the drain 99 have the first conductivity type. The source 98 and the drain 99 are formed beneath the top surface 91a and connect the top surface 91a of the operation region 93a in the vertical direction, and the source 98 and the drain 99 are located below the gate 97 respectively at two sides of the gate in the channel direction (as indicated by the direction of the dashed arrow in FIG. 9B); the source 98 is located in the channel well region 96, and the drain 99 is located in the well region 92 and away from the channel well region 96. The drift region 92a is located between the drain 99 and the channel well region 96 in the channel direction, in the well region 92 near the top surface 91a in the vertical direction, to serve as a drift current channel of the high voltage device 900 during ON operation. From the top view of FIG. 9B, the sub-gate 97' is between the gate 97 and the drain 99 in the channel direction, and the source 98 and the drain 99 are located beneath the top surface 91a and connect the top surface 91a in the vertical direction. The conductive connection structure 95 is formed on the gate 97 and the sub-gate 97' and electrically connects the gate 97 and the sub-gate 97'. The conductive connection structure 95 is made of a conductor which can be formed by, for example but not limited to, metal lines and conductive plugs in a semiconductor manufacturing process, which is known to a person having ordinary skill in the art, so the details thereof are not redundantly explained here. The buried layer 91" which has the first conductivity type is formed beneath the channel well region 96 and connects the channel well region 96. The buried layer 91" in the operation region 93a completely covers the lower side of the channel well region 96. The buried layer 91" is, for example, formed on both sides of the junction surface between the substrate 91 and the semiconductor layer 91' in the vertical direction, i.e., a portion of the buried layer 91" is located in the substrate 91, and a portion of the buried layer 91" is located in the semiconductor layer 91'.

This embodiment differs from the sixth embodiment in that, in the sixth embodiment, the drift oxide region 74 is a LOCOS structure, but in the present embodiment, the drift oxide region 94 is an STI structure. STI is well known to a person having ordinary skill in the art, so the details thereof are not redundantly explained here.

Figure 10A:
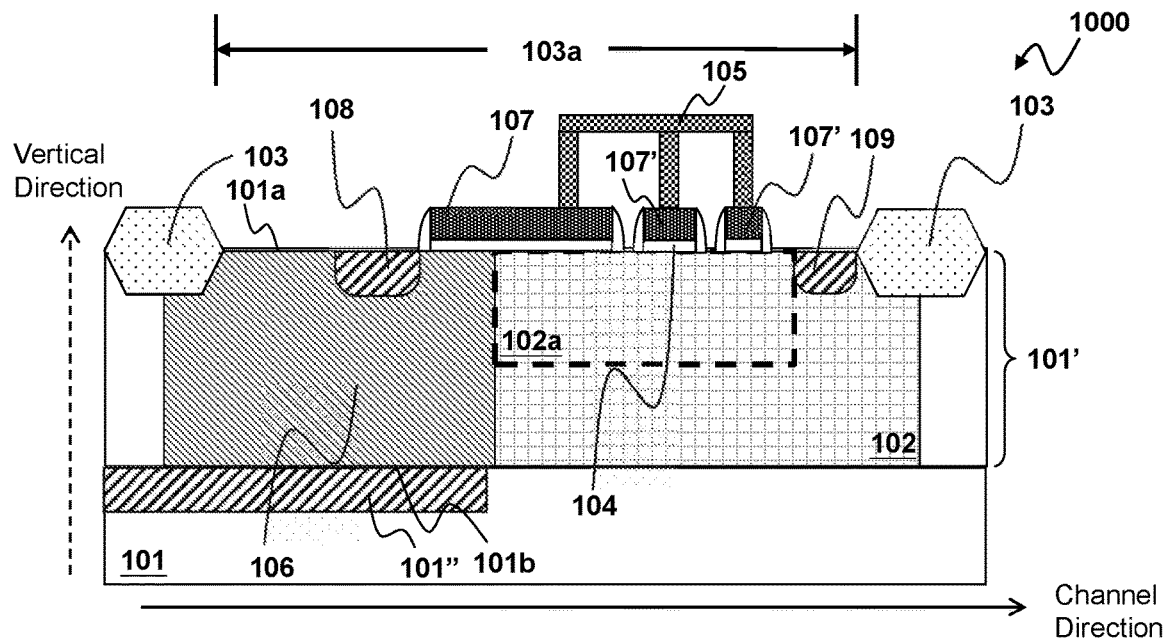
FIGS. 10A and 10B show a ninth embodiment of the present invention.
Figure 10B:
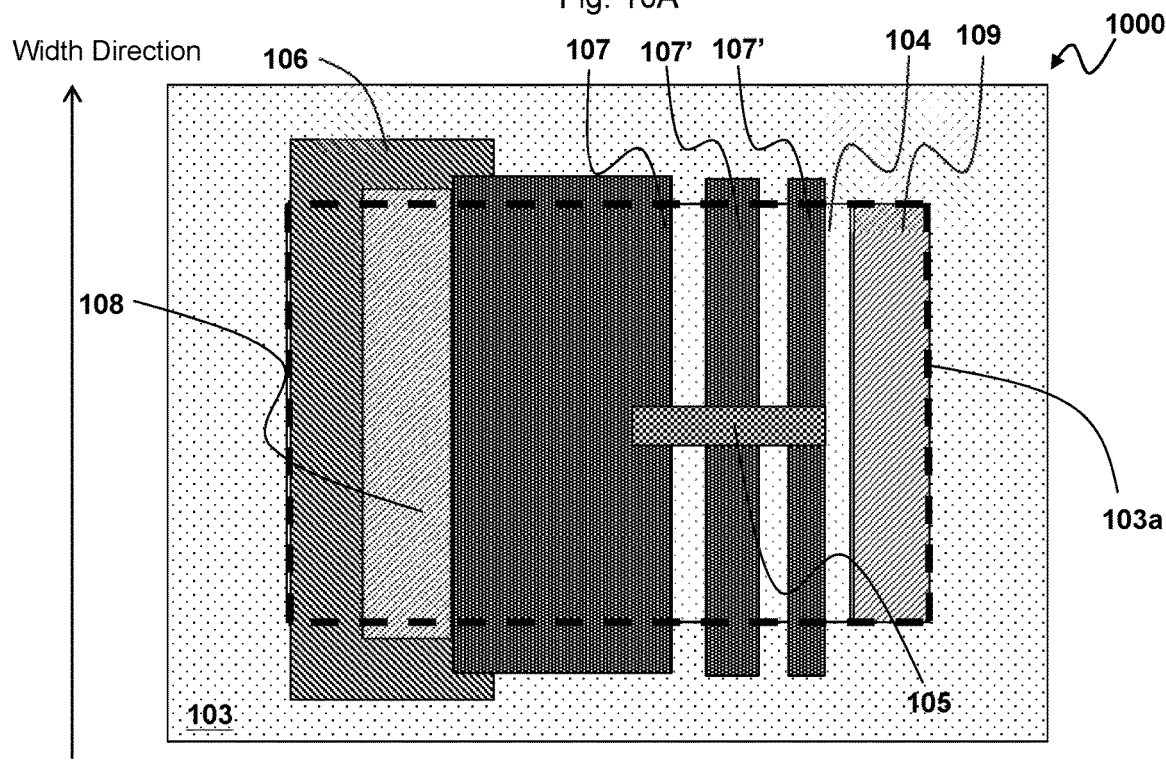

Please refer to FIGS. 10A and 10B, which show a ninth embodiment of the present invention. FIGS. 10A and 10B respectively show a cross-sectional view and a top view of a high voltage device 1000. The high voltage device 1000 includes a semiconductor layer 101', a buried layer 101", a drift well region 102, an isolation structure 103, a drift oxide region 104, a conductive connection structure 105, a channel well region 106, a gate 107, at least one sub-gate 107', a source 108, and a drain 109. The semiconductor layer 101' is formed on the substrate 101, and the semiconductor layer 101' has a top surface 101a and a bottom surface 101b opposite to the top surface 101a in the vertical direction (as indicated by the direction of the dashed arrow in FIG. 9A). The substrate 101 is, for example, a P-type or N-type semiconductor silicon substrate. The semiconductor layer 101', for example, is formed on the substrate 101 by epitaxy, or, a part of the substrate 101 is used to form the semiconductor layer 101'. The semiconductor layer 101' can be formed by various methods known to a person having ordinary skill in the art, so the details thereof are not redundantly explained here.

Still referring to FIGS. 10A and 10B, the isolation structure 103 is formed on the top surface 101a and connects the top surface 101a for defining an operation region 103a (as indicated by the dashed line in FIG. 10B). The isolation structure 103 is not limited to the LOCOS structure as shown in the figure, and may instead be an STI structure. The drift oxide region 104 is formed on the top surface 101a and connects the top surface 101a, and is located on the drift region 102a (as indicated by the dashed line in FIG. 10A) in the operation region 103a and connects the drift region 102a.

The drift well region 102 which has the first conductivity type is formed in the operation region 103a of the semiconductor layer 101', and the drift well region 102 is located beneath the top surface 101a and connects the top surface 101a in the vertical direction. The channel well region 106 which has the second conductivity type is formed beneath the top surface 101a in the operation region 103a, and connects the top surface 101a in the vertical direction. The channel well region 106 connects the drift well region 102 in the channel direction (as indicated by the direction of the solid arrow in FIG. 10A) The gate 107 is formed on the top surface 101a in the operation region 103a of the semiconductor layer 101'. From top view, the gate 107 is substantially a rectangle shape extending along the width direction (as indicated by the direction of the solid arrow in FIG. 10B), wherein a portion of the channel well region 106 is located below the gate 107 and connects the gate 107 in the vertical direction to provide a current channel of the high voltage device 1000 during ON operation.

Still referring to FIGS. 10A and 10B, the sub-gate 107' is formed on the drift oxide region 104 in the operation region 103a. From the top view of FIG. 10B, the sub-gate 107' substantially has a substantially rectangle shape and extends in the width direction in parallel with the gate 107. The sub-gate 107' is located on the drift oxide region 104 and connects the drift oxide region 104 in the vertical direction. In the present embodiment, the high voltage device 1000 includes two sub-gates 107' as an illustrative example. The high voltage device of the present invention may include one or plural sub-gates.

The source 108 and the drain 109 have the first conductivity type. The source 108 and the drain 109 are formed beneath the top surface 101a and connect the top surface 101a of the operation region 103a in the vertical direction, and the source 108 and the drain 109 are located below the gate 107 respectively at two sides of the gate in the channel direction (as indicated by the direction of the dashed arrow in FIG. 10B); the source 108 is located in the channel well region 106, and the drain 109 is located in the well region 102 and away from the channel well region 106. The drift region 102a is located between the drain 109 and the channel well region 106 in the channel direction, in the well region 102 near the top surface 101a in the vertical direction, to serve as a drift current channel of the high voltage device 1000 during ON operation. From the top view of FIG. 10B, the sub-gate 107' is between the gate 107 and the drain 109 in the channel direction, and the source 108 and the drain 109 are located beneath the top surface 101a and connect the top surface 101a in the vertical direction. The conductive connection structure 105 is formed on the gate 107 and the sub-gate 107' and electrically connects the gate 107 and the sub-gate 107'. The conductive connection structure 105 is made of a conductor which can be formed by, for example but not limited to, metal lines and conductive plugs in a semiconductor manufacturing process, which is known to a person having ordinary skill in the art, so the details thereof are not redundantly explained here. The buried layer 101" which has the first conductivity type is formed beneath the channel well region 106 and connects the channel well region 106. The buried layer 101" in the operation region 103a completely covers the lower side of the channel well region 106. The buried layer 101" is, for example, formed on both sides of the junction surface between the substrate 101 and the semiconductor layer 101' in the vertical direction, i.e., a portion of the buried layer 101" is located in the substrate 101, and a portion of the buried layer 101" is located in the semiconductor layer 101'.

This embodiment differs from the sixth embodiment in that, in the sixth embodiment, the drift oxide region 74 is a LOCOS structure, but in the present embodiment, the drift oxide region 104 is formed by a part of a gate oxide layer. The gate oxide layer is for forming the gate dielectric layer of the gate 107, which is well known to a person having ordinary skill in the art, so the details thereof are not redundantly explained here; the drift oxide region 104 can be formed by the same oxidation step when forming the gate dielectric layer of the gate 107.

Figure 11A:
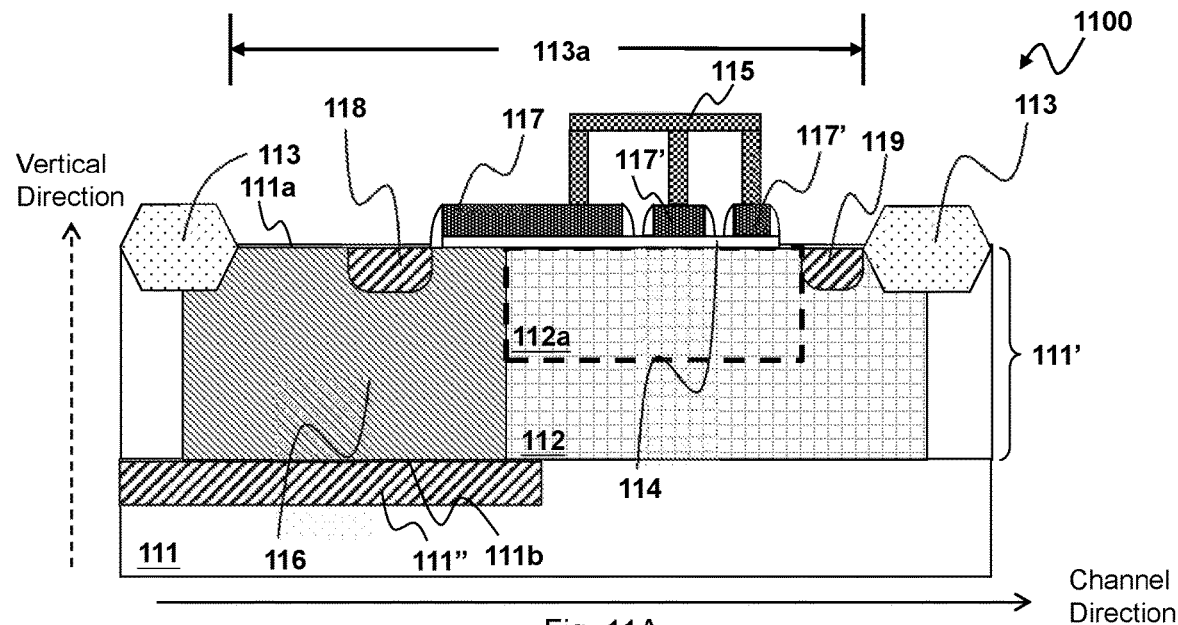
FIGS. 11A and 11B show a tenth embodiment of the present invention.
Figure 11B:
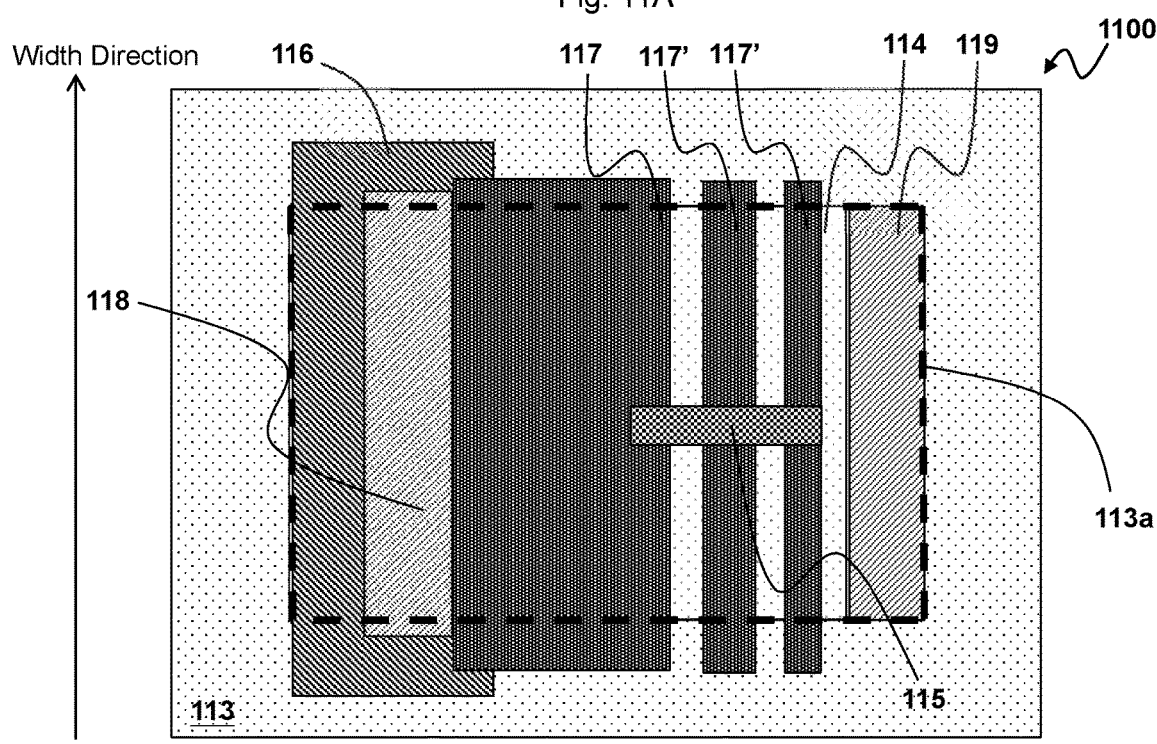

Please refer to FIGS. 11A and 11B, which show a tenth embodiment of the present invention. FIGS. 11A and 11B respectively show a cross-sectional view and a top view of a high voltage device 1100. The high voltage device 1100 includes a semiconductor layer 111', a buried layer 111", a drift well region 112, an isolation structure 113, a drift oxide region 114, a conductive connection structure 115, a channel well region 116, a gate 117, at least one sub-gate 117', a source 118, and a drain 119. The semiconductor layer 111' is formed on the substrate 111, and the semiconductor layer 111' has a top surface 111a and a bottom surface 111b opposite to the top surface 111a in the vertical direction (as indicated by the direction of the dashed arrow in FIG. 11A). The substrate 111 is, for example, a P-type or N-type semiconductor silicon substrate. The semiconductor layer 111', for example, is formed on the substrate 111 by epitaxy, or, a part of the substrate 111 is used to form the semiconductor layer 111'. The semiconductor layer 111' can be formed by various methods known to a person having ordinary skill in the art, so the details thereof are not redundantly explained here.

Still referring to FIGS. 11A and 11B, the isolation structure 113 is formed on the top surface 111a and connects the top surface 111a for defining an operation region 113a (as indicated by the dashed line in FIG. 11B). The isolation structure 113 is not limited to the LOCOS structure as shown in the figure, and may instead be an STI structure. The drift oxide region 114 is formed on the top surface 111a and connects the top surface 111a, and is located on the drift region 102a (as indicated by the dashed line in FIG. 10A) in the operation region 103a and connects the drift region 102a.

The drift well region 112 which has the first conductivity type is formed in the operation region 113a of the semiconductor layer 111', and the drift well region 112 is located beneath the top surface 111a and connects the top surface 111a in the vertical direction. The channel well region 116 which has the second conductivity type is formed beneath the top surface 111a in the operation region 113a and connects the top surface 111a in the vertical direction. The channel well region 116 connects the drift well region 112 in the channel direction (as indicated by the direction of the solid arrow in FIG. 11A). The gate 117 is formed on the top surface 111a in the operation region 113a of the semiconductor layer 111'. From top view, the gate 117 is substantially a rectangle shape extending along the width direction (as indicated by the direction of the solid arrow in FIG. 11B), wherein a portion of the channel well region 116 is located below the gate 117 and connects the gate 117 in the vertical direction to provide a current channel of the high voltage device 1100 during ON operation.

Still referring to FIGS. 11A and 11B, the sub-gate 117' is formed on the drift oxide region 114 in the operating region 113a. From the top view of FIG. 11B, the sub-gate 117' has a substantially rectangle shape and extends in the width direction in parallel with the gate 117. The sub-gate 117' is located on the drift oxide region 114 and connects the drift oxide region 114 in the vertical direction. In the present embodiment, the high voltage device 1100 includes two sub-gates 117' as an illustrative example. The high voltage device of the present invention may include one or plural sub-gates.

The source 118 and the drain 119 have the first conductivity type. The source 118 and the drain 119 are formed beneath the top surface 111a and connect the top surface 111a of the operation region 113a in the vertical direction, and the source 118 and the drain 119 are located below the gate 117 respectively at two sides of the gate in the channel direction (as indicated by the direction of the dashed arrow in FIG. 11B); the source 118 is located in the channel well region 116, and the drain 119 is located in the well region 112 and away from the channel well region 116. The drift region 112a is located between the drain 119 and the channel well region 116 in the channel direction, in the well region 112 near the top surface 111a in the vertical direction, to serve as a drift current channel of the high voltage device 1100 during ON operation. From the top view of FIG. 11B, the sub-gate 117' is between the gate 117 and the drain 119 in the channel direction, and the source 118 and the drain 119 are located beneath the top surface 111a and connect the top surface 111a in the vertical direction. The conductive connection structure 115 is formed on the gate 117 and the sub-gate 117' and electrically connects the gate 117 and the sub-gate 117'. The conductive connection structure 115 is made of a conductor which can be formed by, for example but not limited to, metal lines and conductive plugs in a semiconductor manufacturing process, which is known to a person having ordinary skill in the art, so the details thereof are not redundantly explained here. The buried layer 111" which has the first conductivity type is formed beneath the channel well region 116 and connects the channel well region 116. The buried layer 111" in the operation region 113a completely covers the lower side of the channel well region 116. The buried layer 111" is, for example, formed on both sides of the junction surface between the substrate 111 and the semiconductor layer 111' in the vertical direction, i.e., a portion of the buried layer 111" is located in the substrate 111, and a portion of the buried layer 111" is located in the semiconductor layer 111'.

This embodiment differs from the sixth embodiment in that, in the sixth embodiment, the drift oxide region 114 is a LOCOS structure, but in the present embodiment, the drift oxide region 114 is formed by a part of a gate oxide layer. In addition, in the present embodiment, the drift oxide region 114 is a one-piece structure which differs from the drift oxide region 104 which is divided into different separate sections in the ninth embodiment. The gate oxide layer is for forming the gate dielectric layer of the gate 117, which is well known to a person having ordinary skill in the art, so the details thereof are not redundantly explained here; the drift oxide region 114 can be formed by the same oxidation step when forming the gate dielectric layer of the gate 117.

Figure 12A:
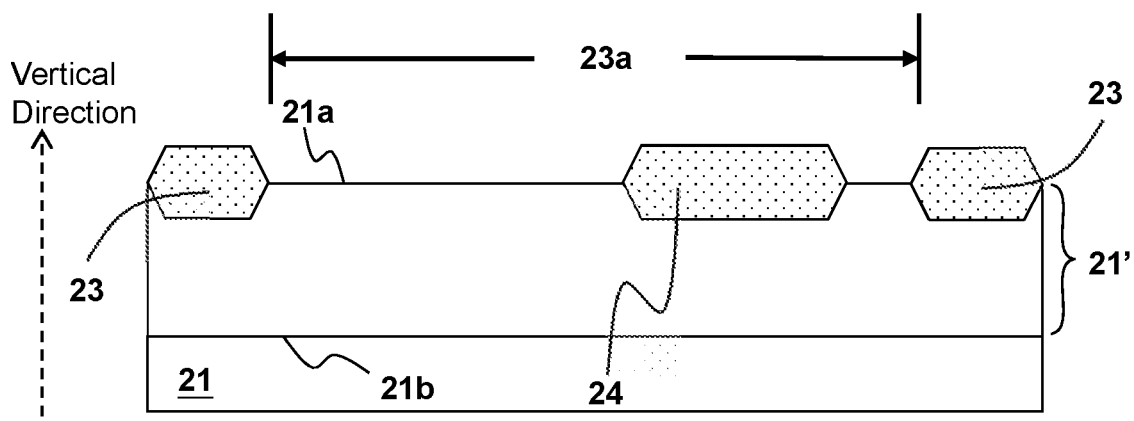
FIGS. 12A to 12G show an eleventh embodiment of the present invention.
Figure 12B:
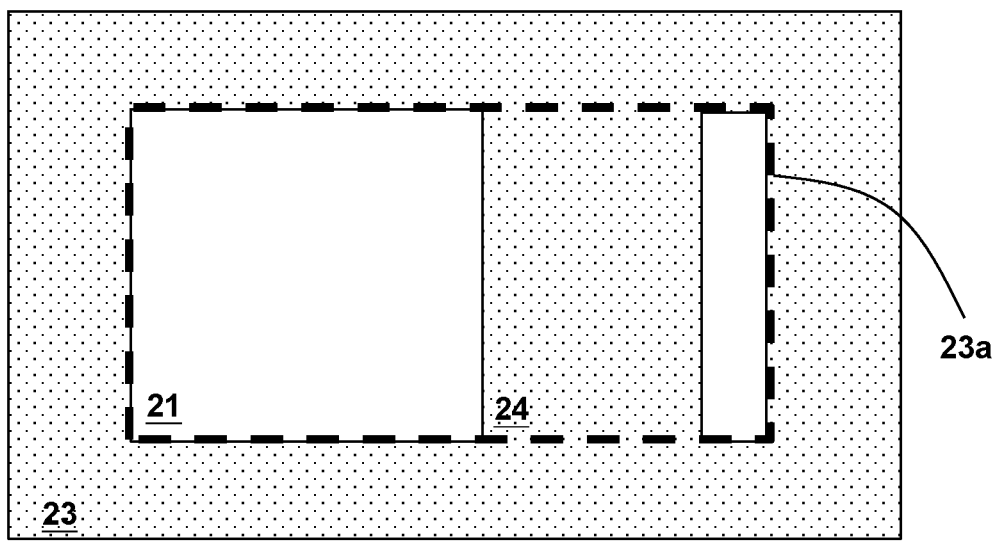
Figure 12C:
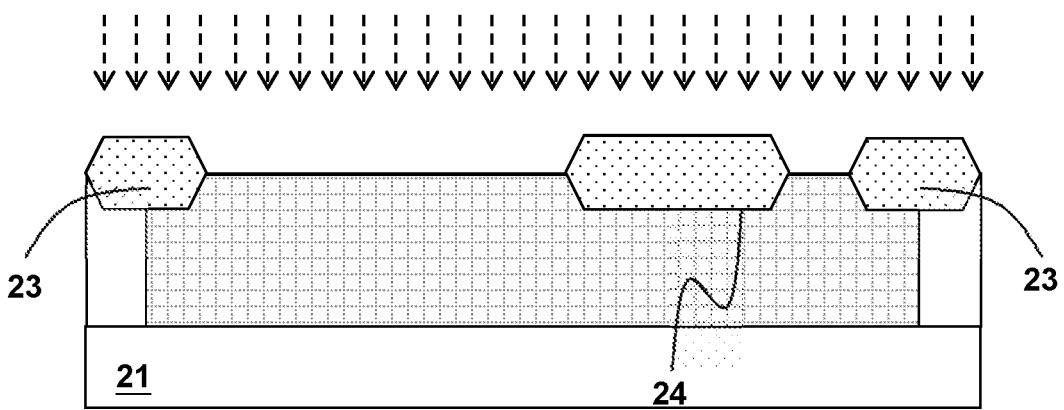

Please refer to FIGS. 12A to 12G show an eleventh embodiment of the present invention. FIGS. 12A to 12G show cross-sectional views (FIGS. 12A,12C,12D,12E,12F, 12G) and a top view (FIG. 12B) of a manufacturing method of a high voltage device 200. As shown in FIGS. 12A and 12B, first, a semiconductor layer 21' is formed on a substrate 21, and the semiconductor layer 21' has a top surface 111a and a bottom surface 111b opposite to the top surface 111a in the vertical direction (as indicated by the direction of the dashed arrow in FIG. 12A). The substrate 21 is, for example, a P-type or N-type semiconductor silicon substrate. The semiconductor layer 21 is, for example, formed on the substrate 21 by epitaxy, or, a part of the substrate 21 is used to form the semiconductor layer 21'. The semiconductor layer 21' can be formed by various methods known to a person having ordinary skill in the art, so the details thereof are not redundantly explained here.

Still referring to FIGS. 12A and 12B, the isolation structure 23 and the drift oxide region 24 are formed on the top surface 21a and connect the top surface 21a. The isolation structure 23 defines an operation region 23a (as indicated by the dashed line in FIG. 12B). The isolation structure 23 is not limited to the LOCOS structure as shown in the figure, and may instead be an STI structure. The drift oxide region 24 is formed on the top surface 21a and connects the top surface 21a, and is located on the drift region 22a (as indicated by the dashed line in FIG. 12A) in the operation region 23a and connects the drift region 22a.

Next, the well region 22 is formed in the operation region 23a of the semiconductor layer 21' and the well region 22 is located beneath the top surface 21 and connects the top surface 21 in the vertical direction. The well region 22 has the first conductivity type, which for example can be formed by implanting impurities of the first conductivity type into the operation region 23a in the form of an accelerated ion, such as the dashed arrows in FIG. 12C.

Figure 12D:
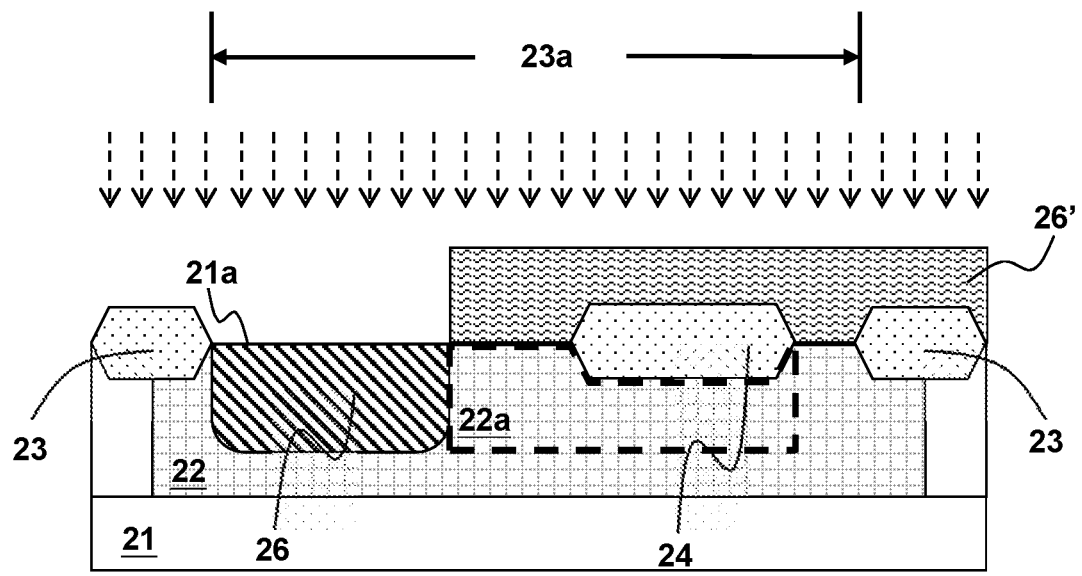

Next, referring to FIG. 12D, the body region 26 is formed in the well region 22 of the operation region 23a, and the body region 26 is located beneath the top surface 21a and connects the top surface 21a in the vertical direction. The body region 26 has the second conductivity type, which for example can be formed by using a photoresist layer 26' as a mask and implanting impurities of the second conductivity type into the well region 22 in the form of accelerated ions.

Figure 12E:
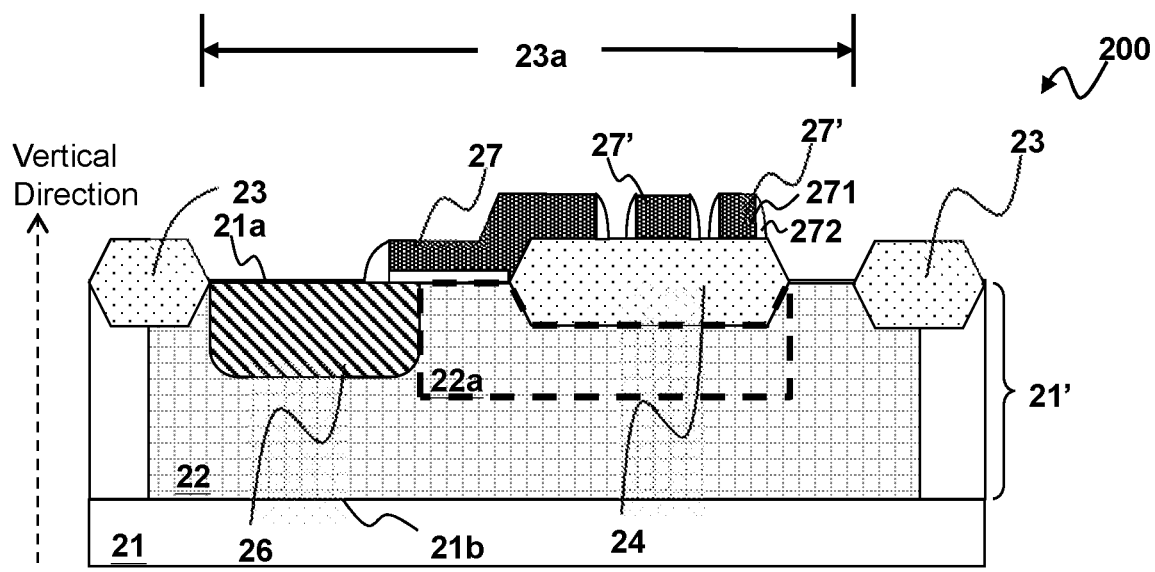

Next, referring to FIG. 12E, the gate 27 is formed on the top surface 21a of the operation region 23a of the semiconductor layer 21. From the top view of FIG. 2B, the gate 27 is substantially a rectangle shape extending along the width direction (as indicated by the direction of the solid arrow in FIG. 2B), wherein a portion of the body region 26 is located below the gate 27 and connects the gate 27 in the vertical direction to provide a current channel of the high voltage device 200 during ON operation.

Still referring to FIG. 12E, for example, in the same process step of forming the gate 27, the sub-gate 27' is formed on the drift oxide region 24 in the operation region 23a of. From the top view of FIG. 2B, the sub-gate 27' has a substantially rectangle shape and extends in the width direction in parallel with the gate 27. The sub-gate 27' is located on the drift oxide region 24 and connects the drift oxide region 24 in the vertical direction. In the present embodiment, includes two sub-gates 27' as an illustrative example. The high voltage device of the present invention may include one or plural sub-gates.

Figure 12F:
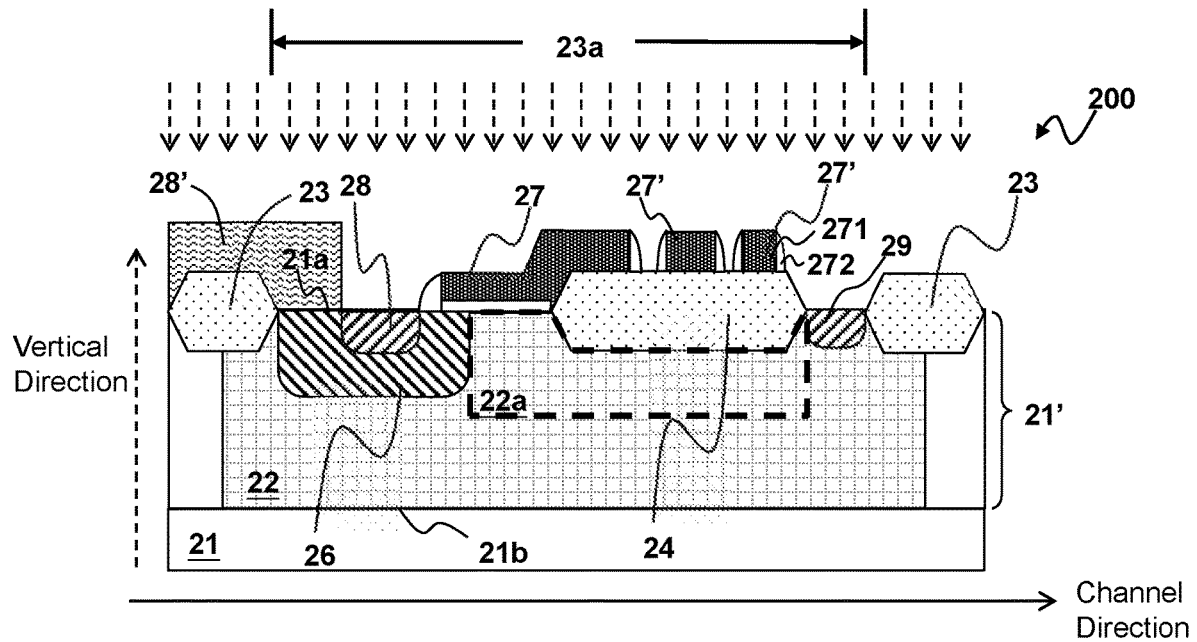

Next, referring to FIG. 12F, the source 28 and the drain 29 are formed beneath the top surface 21a and connect the top surface 21a in the operation region 23a. The source 28 and the drain 29 are formed beneath the top surface 21a and connect the top surface 21a of the operation region 23a in the vertical direction, and the source 28 and the drain 29 are located below the gate 27 respectively at two sides of the gate in the channel direction (as indicated by the direction of the solid arrow in FIG. 12F); the source 28 is located in the body region 26, and the drain 29 is located in the well region 22 and away from the body region 26. The drift region 22a is located between the drain 29 and the body region 26 in the channel direction, in the well region 22 near the top surface 21a, to serve as a drift current channel of the high voltage device 200 during ON operation. From the top view of FIG. 2B, the sub-gate 27' is located between the gate 27 and the drain 29 in the channel direction, and the source 28 and the drain 29 are located beneath the top surface 21a and connect the top surface 21a in the vertical direction (as indicated by the direction of the dashed arrow in FIG. 12F). The source 28 and the drain 29 have the first conductivity type. The source 28 and the drain 29 may be formed by, for example but not limited to, forming a photoresist layer 28' as a mask by a lithography process step, and implanting impurities of the first conductivity type into the body region 26 and the well region 22 in the form of accelerated ions in an ion implantation process step.

Figure 12G:
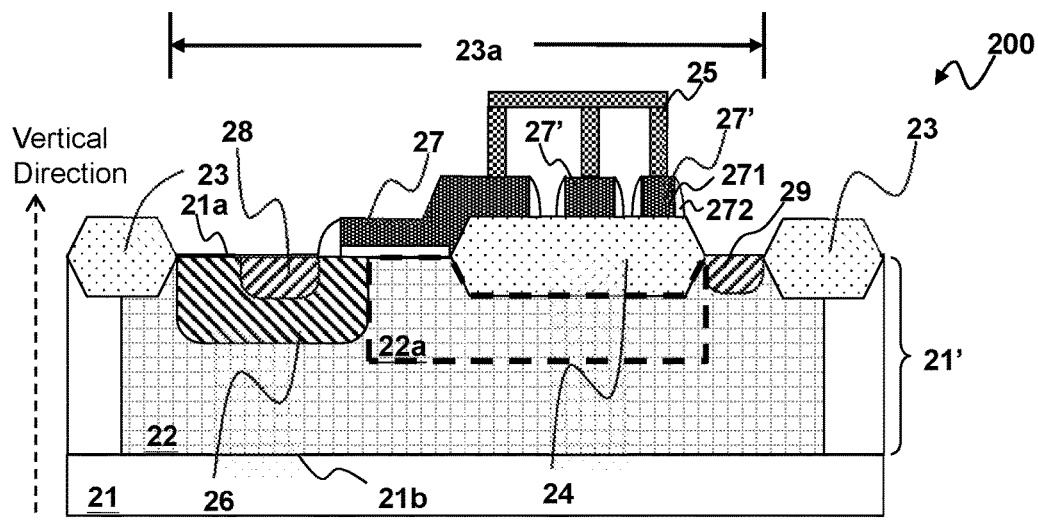

Next, referring to FIG. 12G, the conductive connection structure 25 is formed on the gate 27 and the sub-gate 27', to electrically connect the gate 27 and the sub-gate 27' The conductive connection structure 25 is made of a conductor which can be formed by, for example but not limited to, metal lines and conductive plugs in a semiconductor manufacturing process, which is known to a person having ordinary skill in the art, so the details thereof are not redundantly explained here.

In a preferable embodiment, as shown in FIG. 12G, the sub-gate 27' and the gate 27 are indirectly connected to each other by the conductive connection structure 25 without being directly connected to each other. In a preferable embodiment, as shown in FIG. 12G, the sub-gate 27' includes a sub-gate conductive layer 271 and a sub-gate spacer layer 272. In a preferable embodiment, as shown in FIG. 12G, the drift oxide region 24 is a one-piece structure and is not divided into different separate sections.

Figure 13A:
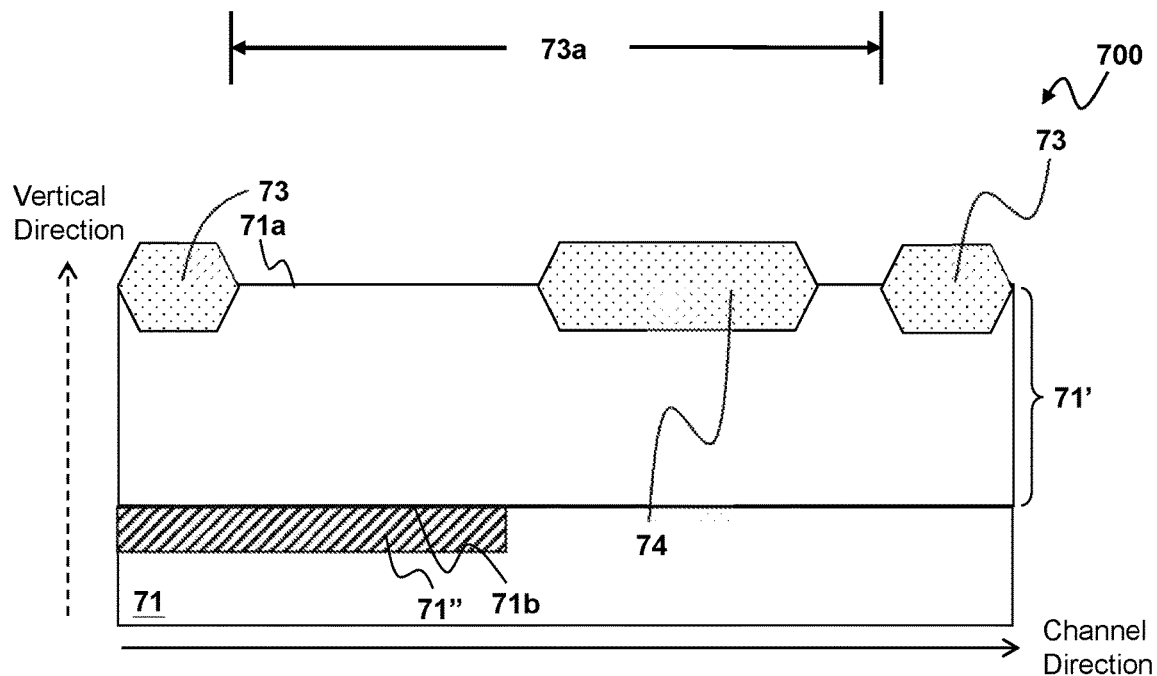
FIGS. 13A to 13F show a twelfth embodiment of the present invention.

Please refer to FIGS. 13A to 13F show a twelfth embodiment of the present invention. FIGS. 13A to 13F show cross-sectional views of a manufacturing method of a high voltage device 700. As shown in FIG. 13A, first, a semiconductor layer 71' is formed on the substrate 71. The semiconductor layer 71' has a top surface 71a and a bottom surface 71b opposite to the top surface 71a in the vertical direction (as indicated by the direction of the dashed arrow in FIG. 13A). The substrate 71 is, for example, a P-type or N-type semiconductor silicon substrate. The semiconductor layer 71', for example, is formed on the substrate 71 by epitaxy, or, a part of the substrate 71 is used to form the semiconductor layer 71'. The semiconductor layer 71' can be formed by various methods known to a person having ordinary skill in the art, so the details thereof are not redundantly explained here.

Next, referring to FIG. 13A, the isolation structure 73 is formed on the top surface 71a and connects the top surface 71a for defining an operation region 73a. The isolation structure 73 is not limited to the LOCOS structure as shown in the figure, and may instead be an STI structure. In one embodiment, at the same time of forming the isolation structure 73, the drift oxide region 74 is formed on the top surface 71a and connects the top surface 71a by the same process step; the drift oxide region 74 is located on the drift region 72a in the operation region 73a (as indicated by a dashed line in FIG. 13B) and connects the drift region 72a. Next, the buried layer 71" is formed beneath the channel well region 76 and connects the channel well region 76, and the buried layer 71" completely covers the lower side of the channel well region 76 in the operating region 73a in the vertical direction. The buried layer 71" is formed, for example, on both sides of the junction surface between the substrate 71 and the semiconductor layer 71', i.e., a portion of the buried layer 71" is located in the substrate 71, and a portion of the buried layer 71" is located in the semiconductor layer 71'. The buried layer 71" which has the first conductivity type, may be formed by, for example, implanting impurities of the first conductivity type into the substrate 71 in the form of accelerated ions in an ion implantation step.

Figure 13B:
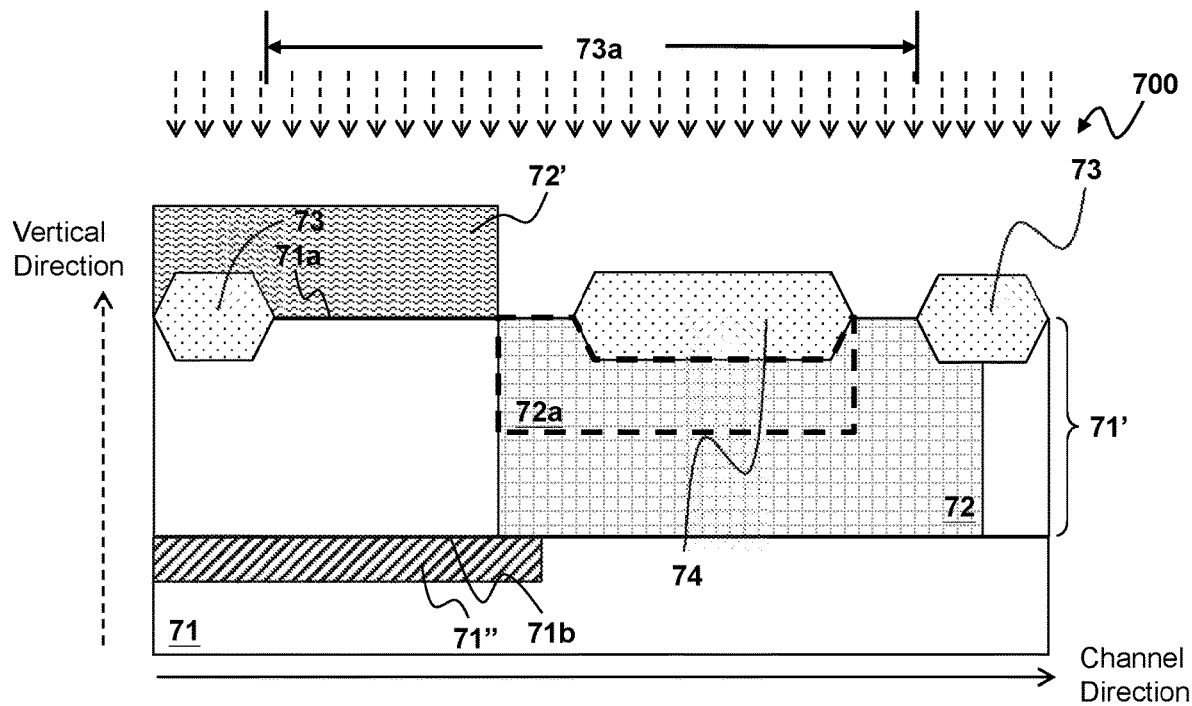

Next, referring to FIG. 13B, the drift well region 72 is formed in the operation region 73a of the semiconductor layer 71', and the drift well region 72 is located beneath the top surface 71a and connects the top surface 71a in the vertical direction. The drift well region 72 has the first conductivity type. The drift well region 72 may be formed by, for example but not limited to, forming a photoresist layer 72' as a mask by a lithography process step, and implanting impurities of first conductivity type to the semiconductor layer 71' in the form of accelerated ions in an ion implantation process step.

Figure 13C:
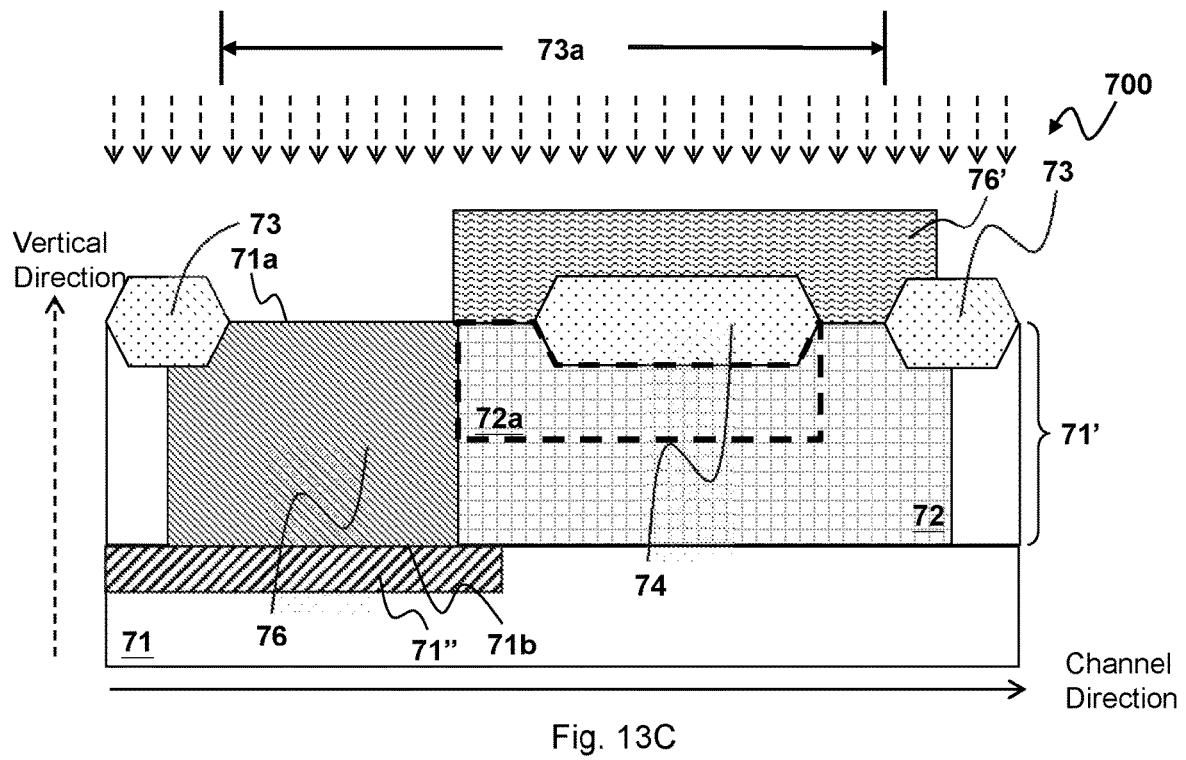

Next, referring to FIG. 13C, the channel well region 76 is formed beneath the top surface 71a in the operation region 73a, and the channel well region 76 is located beneath the top surface 71a and connects the top surface 71a in the vertical direction. The channel well region 76 has the second conductivity type. The drift well region 72 may be formed by, for example but not limited to, forming a photoresist layer 72' as a mask by a lithography process step, and implanting impurities of second conductivity type to the semiconductor layer 71' in the form of accelerated ions in an ion implantation process step.

Figure 13D:
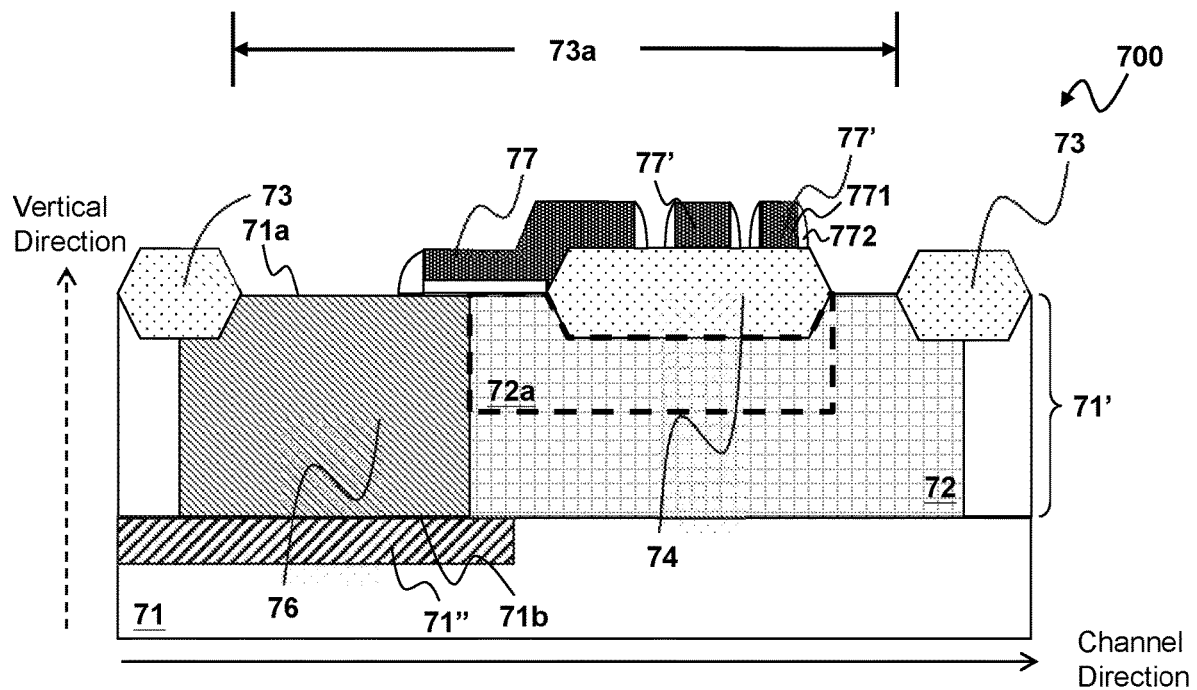

Next, referring to FIG. 13D, the gate 77 is formed on the top surface 71a in the operation region 73a of the semiconductor layer 71. From the top view of FIG. 13D, the gate 77 is substantially a rectangle shape extending along the width direction (as indicated by the direction of the solid arrow in FIG. 7B), wherein a portion of the channel well region 76 is located below the gate 77 and connects the gate 77 in the vertical direction to provide a current channel of the high voltage device 700 during ON operation.

Still referring to FIG. 13D, in one embodiment, in the same process step of forming the gate 77, the sub-gate 77' is formed on the drift oxide region 74 in the operation region 73a. From the top view of FIG. 7B, the sub-gate 77' has a substantially rectangle shape and extends in the width direction in parallel with the gate 77. The sub-gate 77' is located on the drift oxide region 74 and connects the drift oxide region 74 in the vertical direction. In the present embodiment, the high voltage device 700 includes two sub-gates 77' as an illustrative example. The high voltage device of the present invention may include one or plural sub-gates.

Figure 13E:
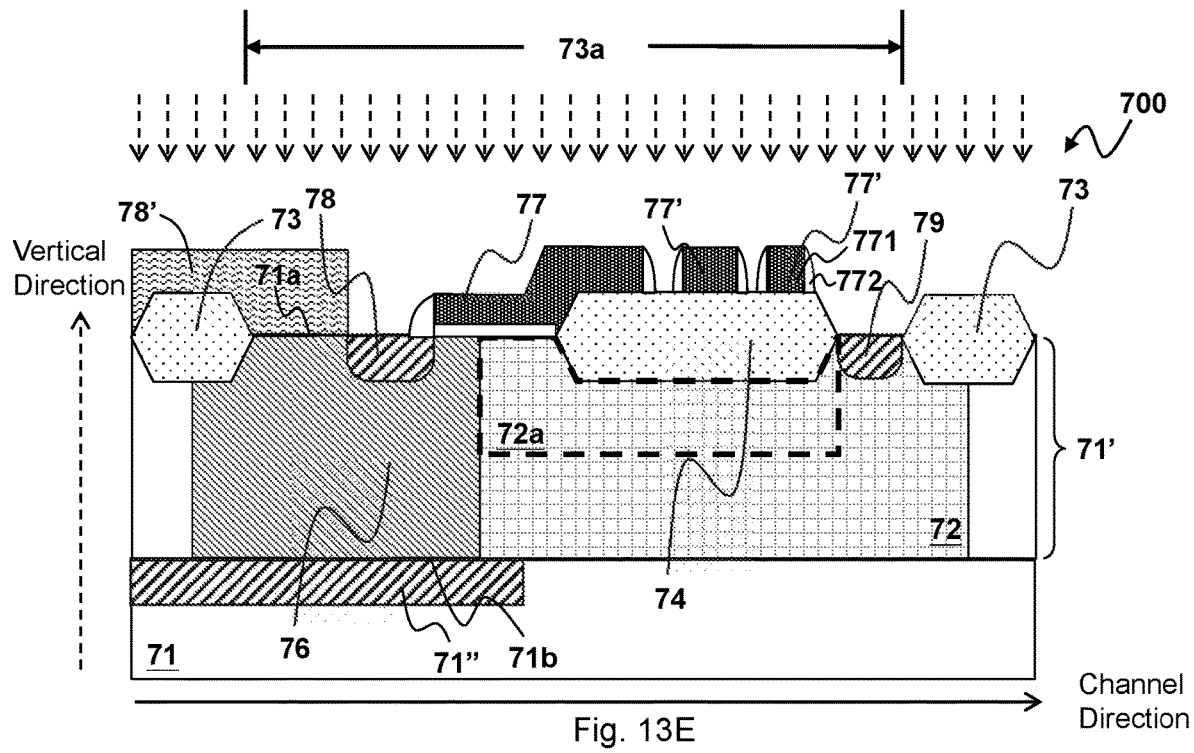

Next, referring to FIG. 13E, the source 78 and the drain 79 which have the first conductivity type are formed beneath the top surface 71a and connect the top surface 71a in the operation region 73a, and the source 78 and the drain 79 are respectively located below the gate 77 respectively at two sides of the gate in the channel direction; the source 78 is located in the body region 76, and the drain 79 is located in the well region 72 and away from the channel well region 76. The drift region 72a is located between the drain 79 and the channel well region 76 in the channel direction, in the well region 72 near the top surface 71a in the vertical direction, to serve as a drift current channel of the high voltage device 700 during ON operation. From the top view of FIG. 7B, the sub-gate 77' is between the gate 77 and the drain 79 in the channel direction, and the source 78 and the drain 79 are located beneath the top surface 71a and connect the top surface 71a in the vertical direction. The source 78 and the drain 79 have the first conductivity type. The source 78 and the drain 79 may be formed by, for example but not limited to, forming a photoresist layer 78' as a mask by a lithography process step, and implanting impurities of the first conductivity type into the channel well region 76 and the well region 72 in the form of accelerated ions in an ion implantation process step.

Figure 13F:
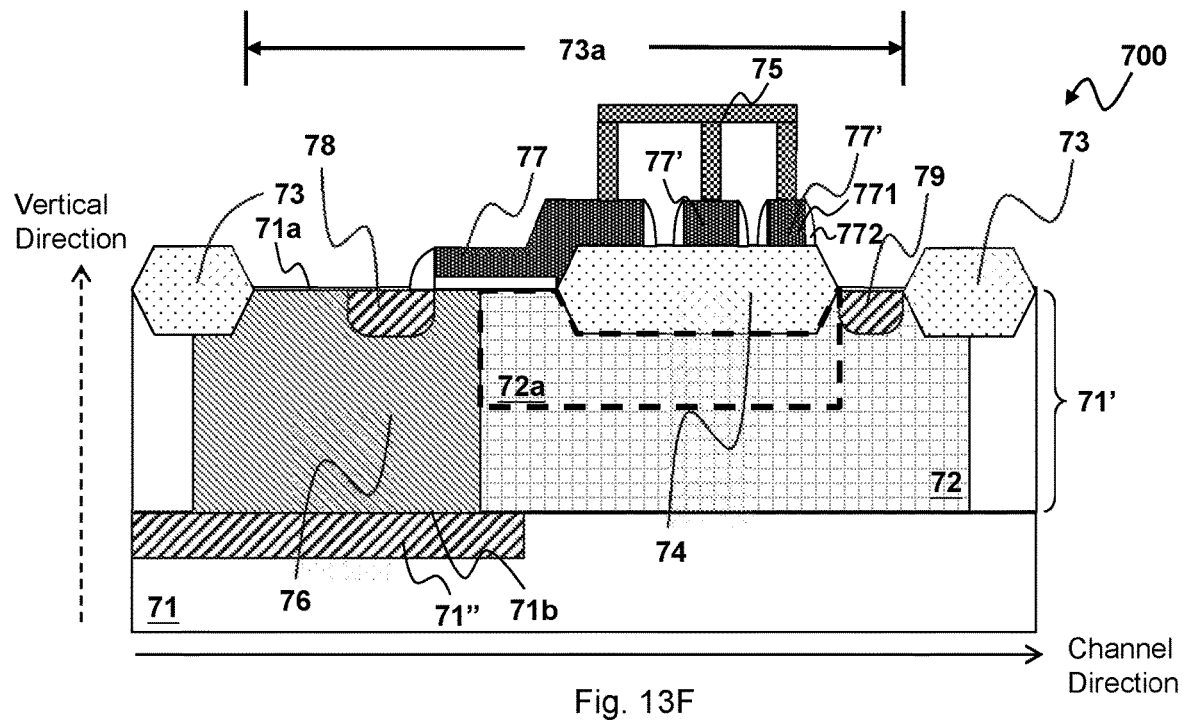

Next, referring to FIG. 13F, the conductive connection structure 75 is formed on the gate 77 and the sub-gate 77', to electrically connect the gate 77 and the sub-gate 77' The conductive connection structure 75 is made of a conductor which can be formed by, for example but not limited to, metal lines and conductive plugs in a semiconductor manufacturing process, which is known to a person having ordinary skill in the art, so the details thereof are not redundantly explained here.

In a preferable embodiment, as shown in FIG. 13F, the sub-gate 77' and the gate 77 are indirectly connected to each other by the conductive connection structure 75 without being directly connected to each other. In a preferable embodiment, as shown in FIG. 13F, the sub-gate 77' includes a sub-gate conductive layer 771 and a sub-gate spacer layer 772. In a preferable embodiment, as shown in FIG. 13F, the drift oxide region 74 is a one-piece structure and is not divided into different separate sections.

Figure 14A:
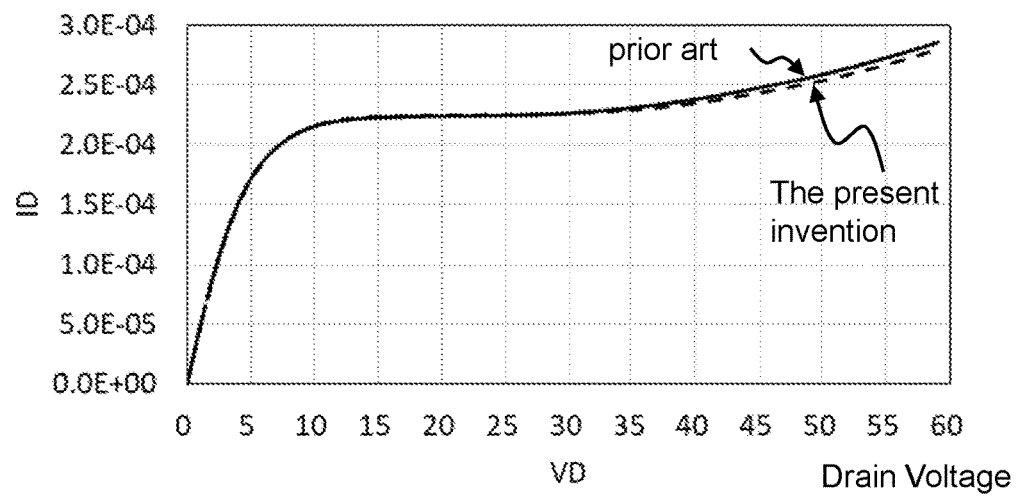
FIG. 14A is a schematic diagram showing the characteristic curve of the breakdown voltage of the present invention during ON operation in comparison to the prior art.

FIG. 14A is a schematic diagram showing the characteristic curve of the breakdown voltage of the present invention during ON operation in comparison to the prior art. As shown in FIG. 14A, the high voltage device of the present invention has a substantially equal breakdown voltage during ON operation compared to the prior art.

Figure 14B:
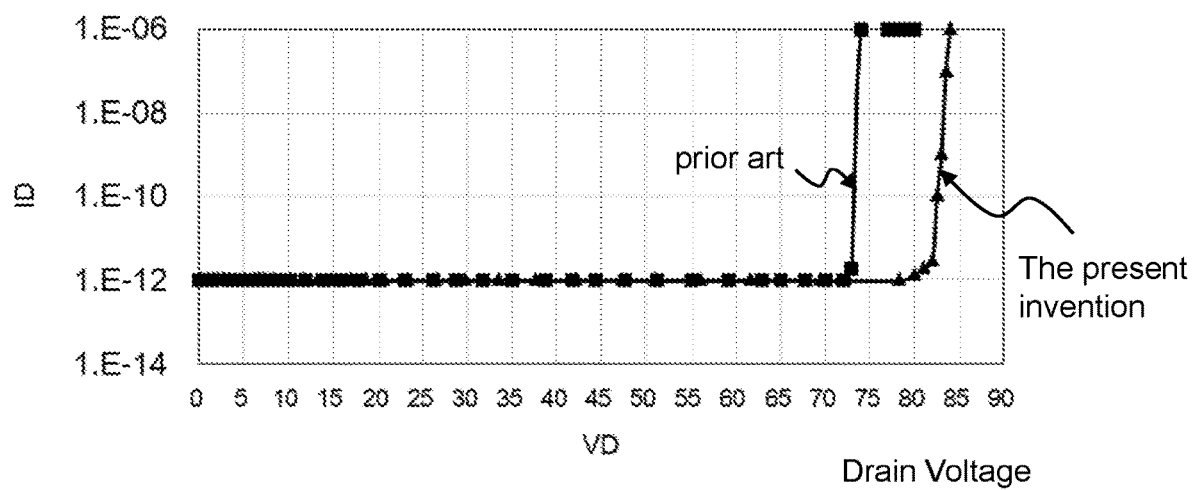
FIG. 14B is a schematic diagram showing the characteristic curve of the breakdown voltage of the present invention during OFF operation in comparison to the prior art.

FIG. 14B is a schematic diagram showing the characteristic curve of the breakdown voltage of the present invention during OFF operation in comparison to the prior art. As shown in FIG. 14B, the high voltage device of the present invention has a significantly higher breakdown voltage during OFF operation compared to the prior art.

Figure 15:
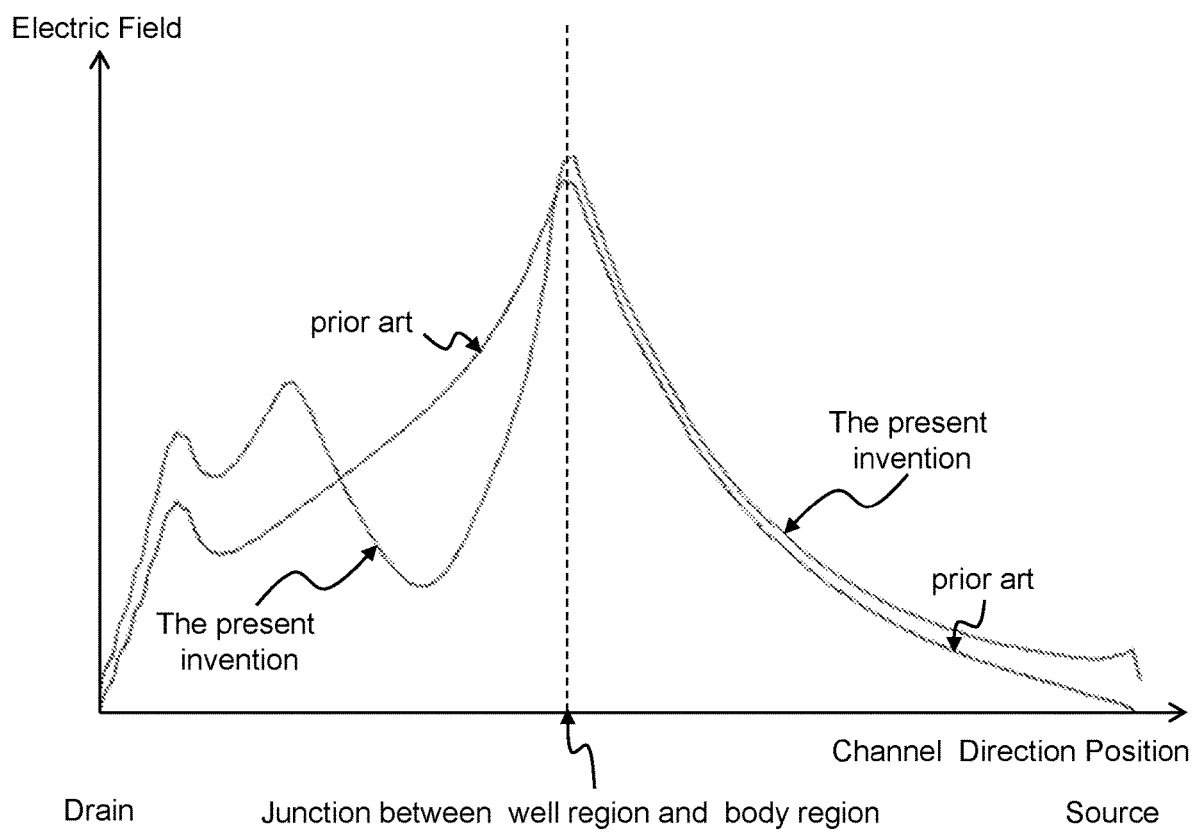
FIG. 15 is a schematic diagram showing characteristic curves of electric field versus channel direction positions at time points when OFF breakdown occurs of the prior art and the present invention respectively.

FIG. 15 is a schematic diagram showing characteristic curves of electric field versus channel direction positions at time points when OFF breakdown occurs of the prior art and the present invention respectively. As shown in FIG. 15, positions along an axis of the channel direction position from left to right, are the drain, a junction between the well region and the body region, and the source. As shown in the figure, when the OFF breakdown occurs, the breakdown voltage of the present invention is higher than which of the prior art. More specifically, the OFF breakdown voltage is defined by an integration of the electric field along the channel direction. As a result, the characteristic curve of the high voltage device according to the present invention with more high electric field peaks has a higher OFF breakdown voltage than the high voltage device of the prior art.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures, such as a deep well region, may be added. For another example, the lithography technique is not limited to the mask lithography technology but it can be electron beam lithography, etc. The various embodiments described above are not limited to being used alone; two embodiments may be used in combination, or a part of one embodiment may be used in another embodiment. One embodiment or one claim does not need to possess all the advantages of the present invention over the prior art. Therefore, the scope of the present invention should include all such variations, modifications and equivalents.

What is claimed is:

1. A high voltage device comprising:
   a semiconductor layer formed on a substrate, wherein the semiconductor layer has a top surface and a bottom surface opposite to the top surface in a vertical direction;
   an isolation structure formed on the top surface and connects the top surface, wherein the isolation structure defines an operation region;
   a drift oxide region formed on the top surface and connects the top surface, wherein the drift oxide region is located on a drift region of the operation region and connects the drift region;
   a well region having a first conductivity type, wherein the well region is formed in the operation region of the semiconductor layer and is located beneath the top surface and connects the top surface in the vertical direction;
   a body region having a second conductivity type, wherein the body region is formed in the well region in the operation region and is located beneath the top surface and connects the top surface;
   a gate formed on the top surface in the operation region of the semiconductor layer, wherein from top view, the gate is substantially a rectangle shape extending along a width direction, and a portion of the body region is located beneath the gate and connects the gate in the vertical direction, to provide a current channel of the high voltage device during ON operation of the high voltage device;
   at least one sub-gate formed on the drift oxide region in the operation region, wherein from top view, the at least one sub-gate is substantially a rectangle shape extending along the width direction and the at least one sub-gate and the gate are arranged in parallel, and the at least one sub-gate is located on the drift oxide region and connects the drift oxide region in the vertical direction;
   a source and a drain having the first conductivity type, the source and the drain being formed beneath the top surface and connect the top surface in the operation region, and the source and the drain being located below the gate respectively at two sides of the gate in a channel direction, wherein the drift region is located between the drain and the body region in the channel direction, in the well region near the top surface, to serve as a drift current channel during ON operation of the high voltage device, and from top view, the at least one sub-gate is located between the gate and the drain in the channel direction; and
   a conductive connection structure made of a conductor, which is located on the gate,
   wherein the conductive connection structure electrically connects the gate and the at least one sub-gate which are at a same elevation level, and the gate continuously extends from above part of the body region to above part of the drift oxide region;
   wherein the drain is in contact with the drift oxide region in the channel direction, and the drift oxide region is a one-piece structure.

2. The high voltage device of claim 1, wherein the drift oxide region includes a local oxidation of silicon (LOCOS) structure or a shallow trench isolation (STI) structure.

3. The high voltage device of claim 1, wherein the at least one sub-gate is indirectly connected with the gate through the conductive connection structure, and the at least one sub-gate and the conductive structure are not directly connected with each other.

4. The high voltage device of claim 1, wherein each of the at least one sub-gate includes a sub-gate conductive layer and a sub-gate spacer.

5. A manufacturing method of a high voltage device, comprising:
   forming a semiconductor layer on a substrate, wherein the semiconductor layer has a top surface and a bottom surface opposite to the top surface in a vertical direction;
   forming an isolation structure on and connecting the top surface, wherein the isolation structure defines an operation region;
   forming a drift oxide region on and connecting the top surface, wherein the drift oxide region is located on a drift region of the operation region and connects the drift region;
   forming a well region in the operation region of the semiconductor layer, wherein the well region is located beneath the top surface and connects the top surface, the well region having a first conductivity type;
   forming a body region in the well region in the operation region, wherein the body region is located beneath the top surface and connects the top surface, the body region having a second conductivity type;
   forming a gate on the top surface in the operation region of the semiconductor layer, wherein from top view, the gate is substantially a rectangle shape extending along a width direction, and a portion of the body region is located beneath the gate and connects the gate in the vertical direction, to provide a current channel of the high voltage device during ON operation of the high voltage device;
   forming at least one sub-gate on the drift oxide region in the operation region, wherein from top view, the at least one sub-gate is substantially a rectangle shape extending along the width direction and the at least one sub-gate and the gate are arranged in parallel, and the at least one sub-gate is located on the drift oxide region and connects the drift oxide region in the vertical direction;
   forming a source and a drain beneath and connecting the top surface in the vertical direction, the source and the drain having the first conductivity type, the source and the drain being formed in the operation region and being located below the gate respectively at two sides of the gate in a channel direction, wherein the drift region is located between the drain and the body region in the channel direction, in the well region near the top surface, to serve as a drift current channel during ON operation of the high voltage device, and from top view, the at least one sub-gate is located between the gate and the drain in the channel direction; and forming a conductive connection structure made of a conductor on the gate, wherein the conductive connection structure electrically connects the gate and the at least one sub-gate which are at a same elevation level, and the gate continuously extends from above part of the body region to above part of the drift oxide region;

wherein the drain is in contact with the drift oxide region in the channel direction, and the drift oxide region is a one-piece structure.

6. The manufacturing method of the high voltage device of claim 5, wherein the drift oxide region includes a local oxidation of silicon (LOCOS) structure or a shallow trench isolation (STI) structure.

7. The manufacturing method of the high voltage device of claim 5, wherein the at least one sub-gate is indirectly connected with the gate through the conductive connection structure, and the at least one sub-gate and the conductive structure are not directly connected with each other.

8. The manufacturing method of the high voltage device of claim 5, wherein each of the at least one sub-gate includes a sub-gate conductive layer and a sub-gate spacer.

9. A high voltage device comprising:
a semiconductor layer formed on a substrate, wherein the semiconductor layer has a top surface and a bottom surface opposite to the top surface in a vertical direction;
an isolation structure formed on the top surface and connects the top surface, wherein the isolation structure defines an operation region;
a drift oxide region formed on the top surface and connects the top surface, wherein the drift oxide region is located on a drift region of the operation region and connects the drift region;
a drift well region having a first conductivity type, wherein the drift well region is formed beneath the top surface in the operation region of the semiconductor layer and the drift well region is located beneath the top surface and connects the top surface in the vertical direction;
a channel well region having the second conductivity type, wherein the channel well region is formed beneath the top surface in the operation region and connects the drift well region in a channel direction;
a buried layer having the first conductivity type, wherein the buried layer is formed beneath the channel well region and connects the channel well region, and the buried layer in the operation region completely covers a lower side of the channel well region;
a gate formed on the top surface in the operation region of the semiconductor layer, wherein the gate is substantially a rectangle shape extending along a width direction, and a portion of the channel well region is located beneath the gate in the vertical direction, to provide a current channel of the high voltage device during ON operation of the high voltage device;
at least one sub-gate formed on the drift oxide region in the operation region, wherein the at least one sub-gate is substantially a rectangle shape extending along the width direction and the at least one sub-gate and the gate are arranged in parallel, and the at least one sub-gate is located on the drift oxide region and connects the drift oxide region in the vertical direction;
a source and a drain having the first conductivity type, the source and the drain being formed beneath the top surface and connect the top surface in the operation region, and the source and the drain being located below the gate respectively at two sides of the gate in a channel direction, wherein the drift region is located between the drain and the channel well region in the channel direction, in the well region near the top surface, to serve as a drift current channel during ON operation of the high voltage device, and from top view, the at least one sub-gate is located between the gate and the drain in the channel direction; and a conductive connection structure made of a conductor, which is located on the gate,
wherein the conductive connection structure electrically connects the gate and the at least one sub-gate which are at a same elevation level, and the gate continuously extends from above part of the body region to above part of the drift oxide region;
wherein the drain is in contact with the drift oxide region in the channel direction, and the drift oxide region is a one-piece structure.

10. The high voltage device of claim 9, wherein the drift oxide region includes a local oxidation of silicon (LOCOS) structure or a shallow trench isolation (STI) structure.

11. The high voltage device of claim 9, wherein the at least one sub-gate is indirectly connected with the gate through the conductive connection structure, and the at least one sub-gate and the conductive structure are not directly connected with each other.

12. The high voltage device of claim 9, wherein each of the at least one sub-gate includes a sub-gate conductive layer and a sub-gate spacer.

13. The high voltage device of claim 9, wherein the drift oxide region is a one-piece structure.

14. A manufacturing method of a high voltage device, comprising:
forming a semiconductor layer on a substrate, wherein the semiconductor layer has a top surface and a bottom surface opposite to the top surface in a vertical direction;
forming an isolation structure on and connecting the top surface, wherein the isolation structure defines an operation region;
forming a drift oxide region on and connecting the top surface, wherein the drift oxide region is located on a drift region of the operation region and connects the drift region;
forming a drift well region beneath the top surface in the operation region of the semiconductor layer, wherein the drift well region has a first conductivity type;
forming a channel well region in the operation region, beneath the top surface in the vertical direction and connecting the drift oxide region in a channel direction, wherein the channel well region has a second conductivity type;
forming a buried layer beneath the channel well region and connecting the channel well region in the vertical direction, wherein the buried layer in the operation region completely covers a lower side of the channel well region, and the buried layer has the first conductivity type;
forming a gate on the top surface in the operation region of the semiconductor layer, wherein from top view, the gate is substantially a rectangle shape extending along a width direction, and a portion of the channel well region is located beneath the gate in the vertical direction, to provide a current channel of the high voltage device during ON operation of the high voltage device;

forming at least one sub-gate on the drift oxide region in the operation region, wherein from top view, the at least one sub-gate is substantially a rectangle shape extending along the width direction and the at least one sub-gate and the gate are arranged in parallel, and the at least one sub-gate is located on the drift oxide region and connects the drift oxide region in the vertical direction;

forming a source and a drain beneath and connecting the top surface in the vertical direction, the source and the drain having the first conductivity type, the source and the drain being formed in the operation region and being located below the gate respectively at two sides of the gate in a channel direction, wherein the drift region is located between the drain and the channel well region in the channel direction, in the well region near the top surface, to serve as a drift current channel during ON operation of the high voltage device, and from top view, the at least one sub-gate is located between the gate and the drain in the channel direction; and forming a conductive connection structure made of a conductor on the gate, wherein the conductive connection structure electrically connects the gate and the at least one sub-gate which are at a same elevation level, and the gate continuously extends from above part of the body region to above part of the drift oxide region;

wherein the drain is in contact with the drift oxide region in the channel direction, and the drift oxide region is a one-piece structure.

15. The manufacturing method of the high voltage device claim 14, wherein the drift oxide region includes a local oxidation of silicon (LOCOS) structure or a shallow trench isolation (STI) structure.

16. The manufacturing method of the high voltage device claim 14, wherein the at least one sub-gate is indirectly connected with the gate through the conductive connection structure, and the at least one sub-gate and the conductive structure are not directly connected with each other.

17. The manufacturing method of the high voltage device claim 14, wherein each of the at least one sub-gate includes a sub-gate conductive layer and a sub-gate spacer.

18. The manufacturing method of the high voltage device claim 14, wherein the drift oxide region is a one-piece structure.

* * * * *